(12) United States Patent
Friedrich et al.

(10) Patent No.: US 11,063,551 B2
(45) Date of Patent: *Jul. 13, 2021

(54) SOLAR CELL MODULE AND ROOF STRUCTURE

(71) Applicant: Kaneka Corporation, Osaka (JP)

(72) Inventors: Stefan Friedrich, Westerlo-Oevel (BE); Yuta Minami, Osaka (JP); Thomas J. Moran, Pasadena, TX (US); Fumihiro Tanikawa, Osaka (JP)

(73) Assignee: KANEKA CORPORATION, Osaka (JP)

( * ) Notice: Subject to any disclaimer, the term of this patent is extended or adjusted under 35 U.S.C. 154(b) by 14 days.

This patent is subject to a terminal disclaimer.

(21) Appl. No.: 16/004,153

(22) Filed: Jun. 8, 2018

(65) Prior Publication Data

US 2018/0294765 A1 Oct. 11, 2018

Related U.S. Application Data

(63) Continuation of application No. PCT/JP2015/084544, filed on Dec. 9, 2015.

(51) Int. Cl.
*H02S 20/25* (2014.01)
*E04D 1/30* (2006.01)
(Continued)

(52) U.S. Cl.
CPC ............... *H02S 20/25* (2014.12); *E04D 1/26* (2013.01); *E04D 1/30* (2013.01); *E04D 1/34* (2013.01);
(Continued)

(58) Field of Classification Search
CPC ....... E04D 5/12; E04D 2001/005; E04D 1/26; E04D 1/34; E04D 1/30; H01R 12/79;
(Continued)

(56) References Cited

U.S. PATENT DOCUMENTS 5,575,861 A * 11/1996 Younan ................... E04D 1/265
136/244
5,990,414 A * 11/1999 Posnansky ............ H01L 31/048
136/244

(Continued)

FOREIGN PATENT DOCUMENTS

DE        20023094 U1    2/2003
JP        H07-026664 A    1/1995
(Continued)

OTHER PUBLICATIONS

International Preliminary Report on Patentability issued in International Application No. PCT/JP2015/084544, dated Jun. 12, 2018 (6 pages).

(Continued)

*Primary Examiner* — Phi D A
(74) *Attorney, Agent, or Firm* — Osha Bergman Watanabe & Burton

(57) ABSTRACT

A solar cell module includes a solar cell section and a step forming plate. The solar cell section includes a front side transparent plate, a back surface member, and a solar cell sealed therebetween. The step forming plate is disposed on a front side of the front side transparent plate, overlapping partly with the front side transparent plate and forming a step between the solar cell section and the step forming plate.

17 Claims, 17 Drawing Sheets

(51) Int. Cl.

| | | |
|---|---|---|
| *F24S 25/61* | (2018.01) | |
| *H02S 30/00* | (2014.01) | |
| *H01L 31/042* | (2014.01) | |
| *E04D 1/26* | (2006.01) | |
| *H01L 31/049* | (2014.01) | |
| *E04D 1/34* | (2006.01) | |
| *F24S 25/60* | (2018.01) | |
| *F24S 20/00* | (2018.01) | |

(52) U.S. Cl.
CPC .......... *H01L 31/042* (2013.01); *H01L 31/049* (2014.12); *H02S 30/00* (2013.01); *E04D 2001/308* (2013.01); *E04D 2001/3426* (2013.01); *E04D 2001/3467* (2013.01); *F24S 25/61* (2018.05); *F24S 2020/13* (2018.05); *F24S 2025/6006* (2018.05); *Y02B 10/10* (2013.01); *Y02E 10/50* (2013.01)

(58) Field of Classification Search
CPC ... H01L 31/0485; H01L 31/05; H01L 31/042; Y02B 10/50
See application file for complete search history.

(56) References Cited

U.S. PATENT DOCUMENTS

| | | | | |
|---|---|---|---|---|
| 6,215,060 | B1* | 4/2001 | Komori | B32B 27/08 |
| | | | | 136/251 |
| 7,642,449 | B2* | 1/2010 | Korman | E04D 3/38 |
| | | | | 136/244 |
| 8,003,882 | B2* | 8/2011 | Pisklak | H01L 31/02245 |
| | | | | 136/251 |
| 8,793,940 | B2* | 8/2014 | Kalkanoglu | H02S 20/25 |
| | | | | 52/173.3 |
| 8,938,920 | B2* | 1/2015 | Cleereman | H01L 31/048 |
| | | | | 52/173.3 |
| 10,432,134 | B2* | 10/2019 | Keenihan | H02S 20/25 |
| 10,584,494 | B2* | 3/2020 | Wise | E04D 5/12 |
| 2001/0045228 | A1 | 11/2001 | Takada et al. | |
| 2008/0289272 | A1* | 11/2008 | Flaherty | H02S 20/25 |
| | | | | 52/173.3 |
| 2009/0133740 | A1* | 5/2009 | Shiao | H01L 31/048 |
| | | | | 136/251 |
| 2009/0255573 | A1* | 10/2009 | Taylor | H02S 20/23 |
| | | | | 136/251 |
| 2009/0301543 | A1* | 12/2009 | Reddy | H01L 31/03925 |
| | | | | 136/244 |
| 2011/0030761 | A1 | 2/2011 | Kalkanoglu et al. | |
| 2011/0100436 | A1* | 5/2011 | Cleereman | H01R 31/00 |
| | | | | 136/251 |
| 2012/0125391 | A1* | 5/2012 | Pinarbasi | H01L 31/0504 |
| | | | | 136/244 |
| 2012/0204927 | A1* | 8/2012 | Peterson | H01L 31/048 |
| | | | | 136/244 |
| 2012/0304559 | A1* | 12/2012 | Ishida | H01L 31/046 |
| | | | | 52/173.3 |
| 2013/0014808 | A1* | 1/2013 | Brounne | H01L 31/0481 |
| | | | | 136/251 |
| 2014/0033625 | A1* | 2/2014 | Jenkins | H02S 20/23 |
| | | | | 52/173.3 |
| 2014/0174510 | A1* | 6/2014 | Kanbara | F16B 5/0607 |
| | | | | 136/251 |
| 2015/0027081 | A1 | 1/2015 | Kalkanoglu et al. | |
| 2015/0188483 | A1* | 7/2015 | Nishio | F24S 25/35 |
| | | | | 136/259 |
| 2015/0295534 | A1* | 10/2015 | Maruyama | H02S 30/10 |
| | | | | 136/251 |
| 2016/0285406 | A1* | 9/2016 | Nishio | H01G 9/2068 |
| 2017/0104446 | A1* | 4/2017 | Sakabe | H02S 40/425 |
| 2017/0126170 | A1* | 5/2017 | Friedrich | F24S 20/69 |
| 2017/0233887 | A1* | 8/2017 | Carberry | C30B 11/065 |
| | | | | 117/78 |
| 2018/0115275 | A1* | 4/2018 | Flanigan | H02S 40/36 |
| 2018/0245343 | A1* | 8/2018 | Steenbakkers-Menting | |
| | | | | E04B 7/12 |

FOREIGN PATENT DOCUMENTS

| | | |
|---|---|---|
| JP | H08-246627 A | 9/1996 |
| JP | H09-111959 A | 4/1997 |
| JP | H11-214724 A | 8/1999 |
| JP | 2001-227109 A | 8/2001 |
| JP | 2003-204073 A | 7/2003 |
| WO | 2015/186237 A1 | 12/2015 |

OTHER PUBLICATIONS

International Search Report issued in International Application No. PCT/JP2015/084544, dated Jan. 12, 2016 (2 pages).
Office Action issued in corresponding European Application No. 15910223.5, dated Jul. 27, 2020 (5 pages).

* cited by examiner

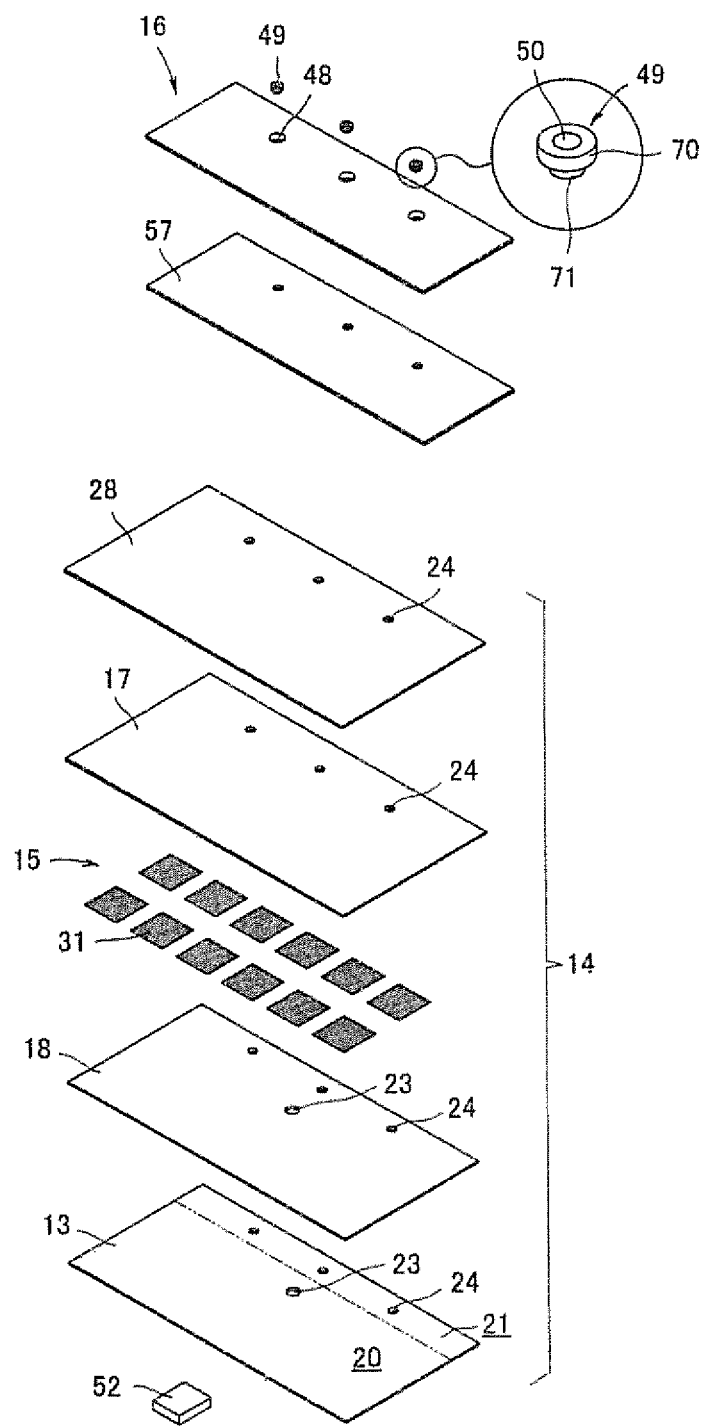

SOLAR CELL MODULE AND ROOF STRUCTURE

TECHNICAL FIELD

One or more embodiments of the present invention relate to a solar cell module, and more particularly, to a solar cell module that is capable of creating a sense of unity with a roof member around the solar cell module when installed on a roof. Further, one or more embodiments of the present invention relate to a roof structure that is formed by laying such a solar cell module.

BACKGROUND

A photovoltaic power generation system that receives sunlight to generate power has become widespread, and the introduction of the photovoltaic power generation system in ordinary households has been underway. Such a photovoltaic power generation system typically generates power by a solar cell module which is disposed on a roof and supplies the generated power.

When a solar cell module is placed on a roof, the appearance of the roof changes, which disadvantageously changes the impression of a house. For example, when the color of a solar cell module and the color of a roof member around the solar cell module largely differ from each other in lightness and chroma when compared, the solar cell module looks conspicuous. Further, when a large gap is formed between a solar cell module and a roof member located under the solar cell module, the solar cell module looks as if it is floating, and the solar cell module thus looks conspicuous.

In these cases, a beautiful appearance having a sense of unity cannot be created on the entire roof. Thus, some people looking at the roof may feel that the appearance is ugly.

Thus, for example, Patent Document 1 discloses a technique relating to the above.

A solar cell module disclosed in Patent Document 1 is integrally fixed onto a roof bed by fixing a pipe-like attachment member on the roof bed and inserting an annular member disposed on a rear face side of the solar cell module into the attachment member. That is, the solar cell module is arranged instead of a roof member such as a tile.

A ridge side part of each solar cell module includes a region for placing an eaves side part of an upper stage solar cell module. The solar cell modules are laid in a partially overlapping manner. That is, no gap is formed in a step part between the solar cell modules which are arranged side by side in a step-like form.

According to such a structure in which the solar cell modules are laid on the roof with no gap therebetween instead of the roof member, no gap is formed between each solar cell module and the roof member located under the solar cell module, and the appearance looks beautiful.

PRIOR ART DOCUMENTS

Patent Documents

Patent Document 1: JP 07-026664 A

However, in the technique of Patent Document 1, although there is no problem when the solar cell modules are laid on the entire roof, the solar cell modules may look conspicuous when the roof members and the solar cell modules are present together on the roof. That is, as described above, a part in which the solar cell modules are laid on the roof may become conspicuous due to a difference in a tone of color between the roof member and the solar cell module.

In the technique of Patent Document 1, the attachment member is located on the rear face side of the solar cell module. Thus, the attachment member is located at a position that is difficult to see. That is, the attachment member is less conspicuous than in a structure in which an attachment metal fitting and a frame member are located at the edge part of the solar cell module. However, in the structure disclosed in Patent Document 1, a part of the attachment member may be exposed through a gap formed between the solar cell module and the roof bed at an eaves side end or the ridge side end. Normally, an eaves edge metal fitting or a flashing plate is attached to the eaves side end and the ridge side end to cover such a gap. However, in this case, the eaves edge metal fitting itself or the flashing plate itself may look conspicuous on the roof.

That is, the technique disclosed in Patent Document 1 has some room for improvement in making the appearance of the roof beautiful.

SUMMARY

Thus, one or more embodiments of the present invention provide a solar cell module that is capable of creating a better sense of unity between the solar cell module and a roof member around the solar cell module and capable of making the appearance of the entire roof more beautiful.

Further, one or more embodiments of the present invention provide a roof structure (or "roof system") that is formed by laying such a solar cell module and has a beautiful appearance.

One or more embodiments of the present invention include: a solar cell section including: a front side transparent plate; a back surface member; and a solar cell sealed therebetween; and a step forming plate, wherein the step forming plate is disposed on a front side of the front side transparent plate, overlapping partly with the front side transparent plate to constitute a step between the solar cell section and the step forming plate.

The back surface member may be a sheet made of resin. The back surface member may be thin and low in rigidity. Further, the back surface member may have rigidity as glass. The "state of overlapping" includes a case where a sheet, resin, or the like is interposed between the two, in addition to a case where the two are in direct contact with each other. It is desirable that the step forming plate is a decorative glass.

According to one or more embodiments of the present invention, the front side transparent plate located on the front side of the solar cell and the step forming plate overlap with each other, and a step is formed therebetween. That is, the step is formed on an upper side of the front side transparent plate, which is a lighting surface of the solar cell.

When the roof members are laid on the roof, a step is typically formed in an overlapping part between the roof members adjacent in an eaves-ridge direction.

That is, a step like the step formed in the overlapping part between the roof members is formed on an exposed part of the solar cell module, so that a part in which the solar cell module is located and a part in which the roof member is located are difficult to visually distinguish when the solar cell modules and the roof members are present together. Accordingly, there is provided a roof having a better sense of unity between the solar cell module and the roof member around the solar cell module.

It is desirable that the step forming plate has a light transmissive property.

By adopting the step forming plate having a light transmissive property, it is possible to provide a roof having a better sense of unity between the solar cell module and the roof member around the solar cell module.

It is desirable that a solar cell includes crystalline solar cells planarly unevenly distributed between the front side transparent plate and the back surface member, wherein the solar cell module includes: a cell installation region including the plurality of crystalline solar cells, each of the crystalline solar cells being disposed with an interval equal to or less than a predetermined distance to, or in contact with the adjacent crystalline solar cell; and a surplus region not including any of the crystalline solar cells, wherein the step forming plate has a light transmissive property, and wherein the step forming plate is disposed over the surplus region and a part of the cell installation region.

The step forming plate is placed in a part of the cell installation region. Here, since the step forming plate has a light transmissive property, a crystalline solar cell located under the step forming plate can also contribute to power generation.

In each aspect described above, it is desirable that the step forming plate is disposed on the front side of the front side transparent plate, overlapping with 30% or more of a light receiving surface of the solar cell.

Further, in each aspect described above, it is desirable that the step forming plate and the solar cell section include each a through hole, both the through holes communicating with each other to constitute a communicating hole, and the solar cell module is fixable to an outer member by inserting a fastening element into the communicating hole.

Further, it is desirable that a tubular member is provided inside the communicating hole, a tip of the tubular member protruding from the back surface member to a rear face side of the solar cell module to be capable of protruding into another member.

Further, it is desirable that a tubular member is provided inside the communicating hole, the tubular member being embedded in the communicating hole without protruding at least over a front side of the solar cell module.

For example, the front side transparent plate is a glass plate, and a front face of the front side transparent plate includes: a roughened part that is roughened and planarly distributed; and a smooth part that keeps smoothness and linearly extends vertically and/or horizontally, the smooth part separating the roughened part into a plurality of quadrangular shapes.

According to one or more embodiments of the present invention, the texture of the surface of the front side transparent plate located on the upper side of the solar cell can be made like the texture of the surface of the roof member. That is, the surface of the front side transparent plate and the surface of the roof member can be made extremely similar to each other in color and surface roughness.

Accordingly, when the solar cell module and the roof member are present together, a part in which the solar cell module is located and a part in which the roof member is located can be made difficult to visually distinguish. Thus, the sense of unity on the entire roof can be improved.

Further, in the above-described aspect, it is desirable that the solar cell module is laid on a roof in combination with a roof member of another structure (or "another system"), the another structure includes a first and a second roof members, the first and the second roof members are adjacent to each other in a ridge direction, and the solar cell module imitates a shape in which the second roof member is laid on a part of the first roof member in the ridge direction.

Further, in the above-described aspect, it is desirable that the first and the second roof members of the another structure are each a non-functional tile material having no power generating function, the second roof member is laid on the first roof member, overlapping partly with the first roof member, an exposed part of the first roof member other than a part overlapping with the second roof member being exposed to an open area, and a width in a eaves-ridge direction of a first exposed region of the front side transparent plate is substantially equal to a width in the eaves-ridge direction of the exposed part, the first exposed region being a region not overlapping with the step forming plate.

Here, "substantially equal" refers to a state where no difference is noticed when the solar cell module is installed on a roof and observed from the ground.

Further, in each aspect described above, it is desirable that the first and the second roof members of the another structure are each a non-functional tile material having no power generating function, the second roof member is laid on the first roof member, overlapping partly with the first roof member, an exposed part of the first roof member other than a area overlapping with the second roof member being exposed to an open area, the solar cell module is a first solar cell module, the first solar cell module being adjacent to a second solar cell module in the ridge direction, the second solar cell module or the roof member is laid on the first solar cell module, overlapping partly with the first solar cell module, a second exposed region being a region of the step forming plate of the first solar cell module other than a region overlapping with the second solar cell or the roof member, and a width in a eaves-ridge direction of the second exposed region of the step forming plate is substantially equal to a width in the eaves-ridge direction of the exposed part.

One or more embodiments of the present invention relate to a roof structure (or "roof system") including a plurality of the above solar cell modules, the solar cell modules being laid on a top face of a building, wherein the solar cell modules includes a first solar cell module and a second solar cell module, and wherein a part of a region corresponding to the cell installation region of the second solar cell module is laid on the surplus region of the first solar cell module.

Also in this aspect, it is possible to provide a roof having a beautiful appearance in which no attachment member is conspicuous and to more reliably prevent the occurrence of rain leaking.

In each aspect described above, it may be possible that a roof member having a water proofing property and formed in a certain shape is used together with the solar cell module in the roof structure, and the roof structure includes a region in which the roof member is laid while the solar cell module is not laid, and a region in which the solar cell module is laid while the roof member is not laid.

One or more embodiments of the present invention relate to a roof structure (or "roof system") including the above solar cell modules, the solar cell modules being laid on a top face of a building, wherein the solar cell modules includes a first and a second solar cell modules, and wherein a region corresponding to the solar cell section of the second solar cell module is laid on the step forming plate of the first solar cell module in a shifted manner.

Also in these aspect, since a step like the step formed in the overlapping part between the roof members is formed on the exposed part of the solar cell module, a part in which the solar cell module is located and a part in which the roof member is located can be made difficult to visually distinguish when the solar cell modules and the roof members are present together. Accordingly, it is possible to provide a roof having a better sense of unity between the solar cell module and the roof member around the solar cell module.

One or more embodiments of the present invention relate to a roof structure (or "roof system") using a solar cell module in which a tubular member is provided inside the communicating hole, a tip of the tubular member protruding from the back surface member to a rear face side of the solar cell module to be capable of protruding into another member, wherein a crosspiece is provided on the top face of the building, wherein the solar cell module is laid on the crosspiece while the tip of the tubular member penetrates into the crosspiece, and wherein the fastening element protrudes from the tubular member to be joined into the crosspiece, fixing the solar cell module to the crosspiece.

According to this aspect, the solar cell module can be firmly mounted to the building.

In a roof structure in which a solar cell module having a tubular member is laid on a top face of a building, it may be possible that the fastening element is inserted through the tubular member to fix the solar cell module to the building while the fastening element does not protrude from the front side of the solar cell module.

One or more embodiments of the present invention make it possible to create a better sense of unity between the solar cell module and the roof member around the solar cell module and to make the appearance of the entire roof more beautiful.

BRIEF DESCRIPTION OF DRAWINGS

FIG. 5 is a perspective view illustrating a lamination relationship of individual members forming the solar cell module of FIG. 3, and illustrating a state before the solar cell module and the step forming plate are surface-treated.

FIGS. 6A and 6B are views illustrating a bushing member of FIG. 4, wherein FIG. 5A is a front view, and FIG. 5B is a sectional view.

FIGS. 7A and 7B are sectional views illustrating the bushing member and the surroundings thereof when a decorative glass is being laminated on a solar cell section via an EVA sheet, wherein FIG. 7A illustrates a state before the lamination of the EVA sheet and the decorative glass, and FIG. 7B illustrates a state after the lamination of the EVA sheet and the decorative glass.

FIGS. 14A and 14B are sectional views illustrating the bushing member and the surroundings thereof when the solar cell module is fixed to a purlin member, wherein FIG. 14A illustrates a state before insertion of a fastening element, and FIG. 14B illustrates a state after the insertion of the fastening element.

DETAILED EXPLANATION OF EMBODIMENTS

Hereinbelow, a roof structure 1 according to one or more embodiments of the present invention will be described in detail with reference to the drawings. In the following description, a front-back direction, an up-down direction, and a right-left direction are described based on a normal installation state illustrated in FIG. 1 unless otherwise specifically noted.

Figure 1:
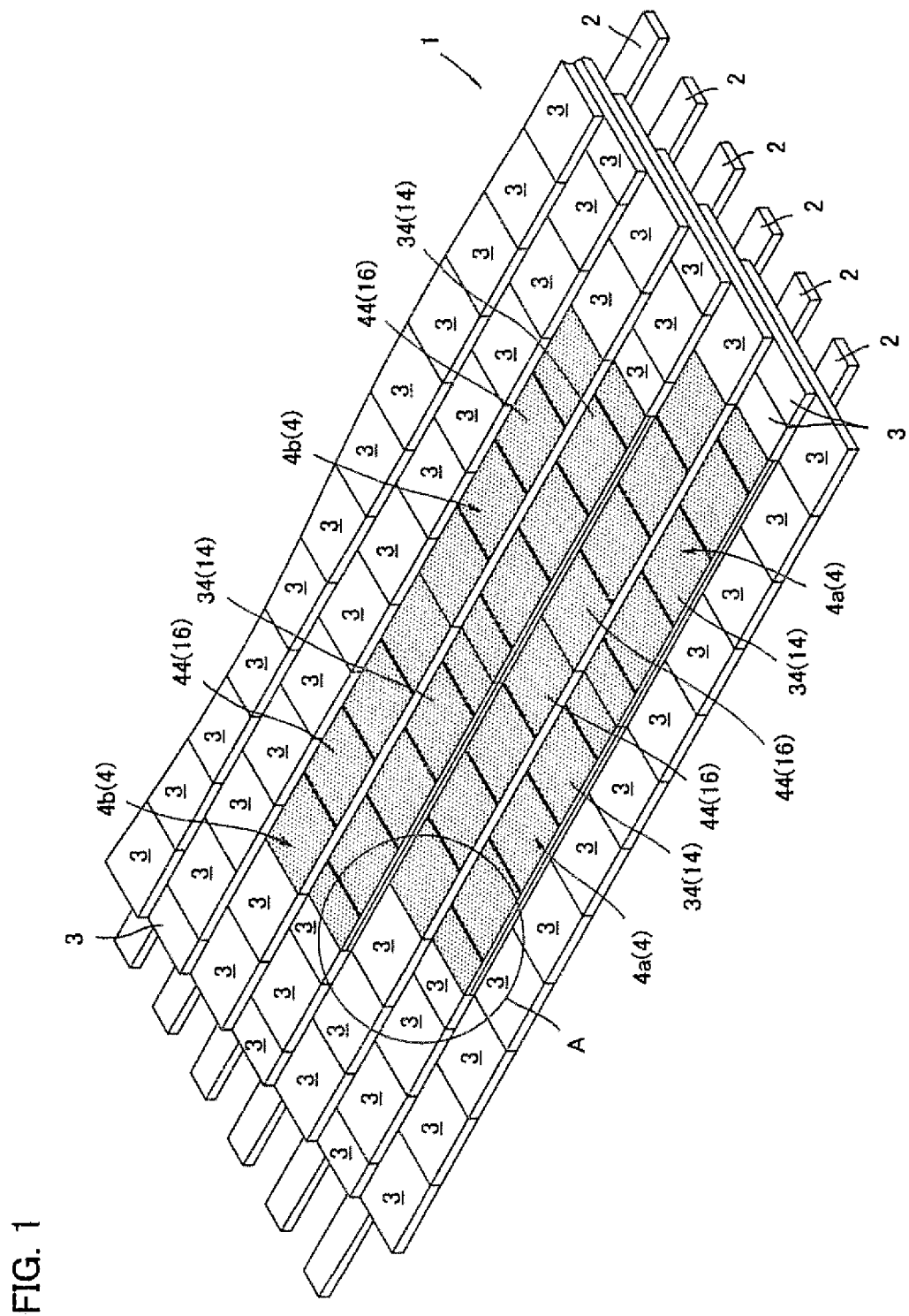
FIG. 1 is a perspective view illustrating a roof structure according to one or more embodiments of the present invention, in which a slate tile and a solar cell module are mixed.

As illustrated in FIG. 1, the roof structure 1 of the present embodiment is formed by fixing a slate tile 3 (roof member) and a solar cell module 4 to a plurality of purlin members 2 (crosspieces, outer members) which are arranged side by side at predetermined intervals in the eaves-ridge direction (a direction from an eaves edge toward a ridge side).

Each of the purlin members 2 is a wooden member having a prism shape, and extends in a horizontal direction (a direction perpendicular to the eaves-ridge direction). The individual purlin members 2 arranged parallelly at predetermined intervals are parallel to a ridge pole and a pole plate (not shown). That is, the plurality of purlin members 2 are attached to a roof part (top face) of a building and arranged side by side parallel to each other.

The slate tile 3 is a substantially rectangular plate-like roof member formed by shaping a cut-out natural rock. The slate tile 3 may be obtained by shaping an artificially composed material.

The slate tile 3 is a non-functional tile material having no power generating function.

Figure 2:
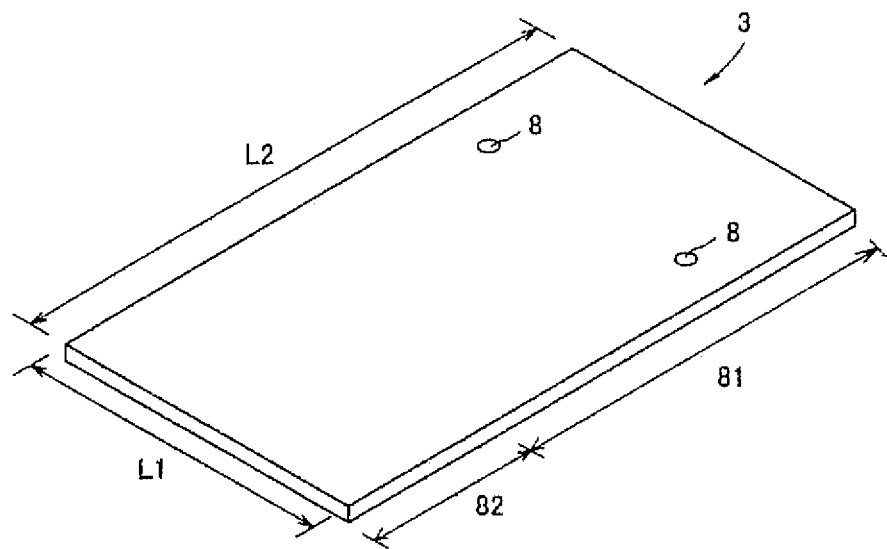
FIG. 2 is a perspective view of the slate tile to be adopted in the roof structure of FIG. 1.

As illustrated in FIG. 2, in the slate tile 3, an eaves-ridge direction length L2 is longer than a width L1. More specifically, the width L1 is approximately 250 mm, the eaves-ridge direction length L2 is approximately 500 mm, and a thickness is approximately 4 mm. Thus, the eaves-ridge direction length L2 is approximately twice the width L1.

The slate tile 3 is formed to have an attachment hole 8 which penetrates the slate tile 3 itself in the thickness direction. The attachment hole 8 is formed in a part that is located on the ridge side with respect to the center in the eaves-ridge direction, and located at a position slightly off to the center from an end in a width direction (horizontal direction). In the present embodiment, the slate tile 3 includes two attachment holes 8 in total each of which is formed near each end in the width direction thereof. The two attachment holes 8 are arranged side by side with an interval in the width direction. In other words, in the slate tile 3 of the present embodiment, a plurality of attachment holes 8 are formed to be arranged side by side in the width direction.

The appearance of the solar cell module 4 imitates an appearance of overlapped slate tiles 3.

In the roof formed only of the slate tile 3, a slate tile 3 is laid on a part of a slate tile 3 adjacent in the ridge direction in an overlapping manner. The solar cell module 4 of the present embodiment is made to resemble a shape obtained by overlaying a slate tile 3 on a part of a slate tile 3 adjacent in the ridge direction.

Figure 4:
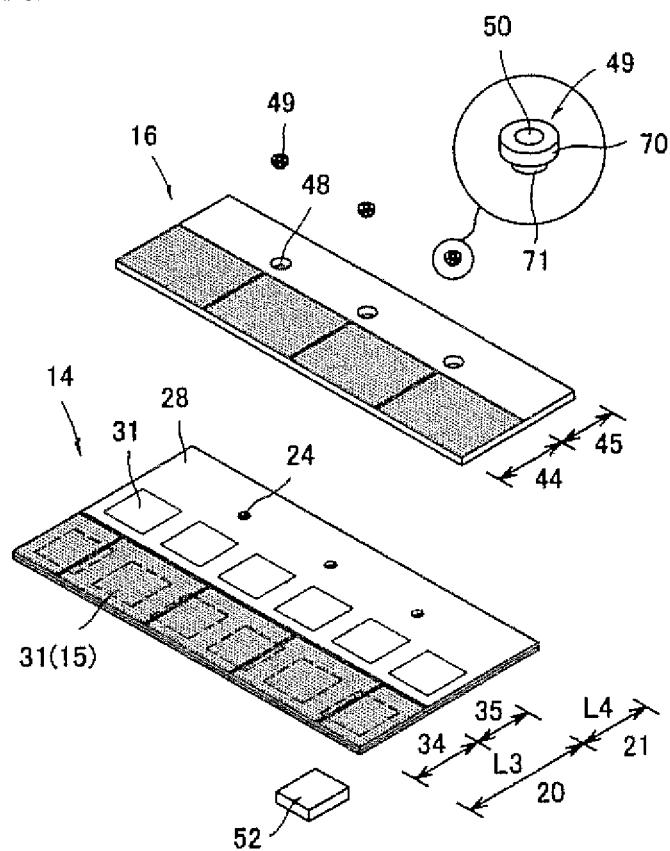
FIG. 4 is an exploded perspective view of the solar cell module of FIG. 3, illustrating a state in which the solar cell module is separated into a cell section, a step forming plate, and a terminal box.

As shown in FIG. 4, the solar cell module 4 is formed by a solar cell section 14 and a decorative glass 16 (step forming plate).

Further, the solar cell section 14 is a substantially rectangular plate-like member having a substantially quadrangular shape in plan view. As shown in FIG. 5, in the solar cell section 14, a solar cell 15 is sealed between a cover glass 28 (front side transparent plate) and a back surface member 13.

In the present embodiment, the solar cell 15 is formed by a large number of solar cells 31.

Each of the solar cells 31 is a crystalline solar cell 31 mainly composed of crystalline silicon. In this embodiment, a heterojunction solar cell is adopted.

In the present embodiment, a shape of the crystalline solar cell 31 is substantially square. Further, in the present embodiment, twelve solar cells 31 are sealed between the cover glass 28 (front side transparent plate) and the back surface member 13.

The back surface member 13 is a protective sheet, made by sandwiching both sides of a metal foil such as aluminum foil as a center, with resin. Examples of the back surface member 13 include one formed by coating both sides of a metal foil with resin, one formed by bonding a resin film to a metal foil, and one formed by extruding such that resin surrounds the metal foil.

The back surface member 13 is a sheet or a film whose outer shape is substantially rectangular plate-like shape, and has a function as a sealing member that seals the rear face side of the solar cell section 14 and a function as a back surface protection member.

As the back surface member 13, a laminated film of PET/aluminum/PVF, PET/aluminum/PET, or the like can be used.

Sealing sheets 17 and 18 are interposed between the cover glass 28 (front side transparent plate) and the back surface member 13.

The sealing sheets 17 and 18 are resin sheets, and are sealing resin sheets made of any one of or a mixture of ethylene vinyl acetate (EVA), PVB, ionomer of ethylene-unsaturated carboxylic acid copolymer, thermoplastic elastomer, and the like.

In the present embodiment, an ethylene vinyl acetate (EVA) sheet is adopted as the sealing sheets 17 and 18. A part or a whole of the EVA sheet layer melts in the solar cell section 14 and also serves as an adhesive layer.

To be precise, as shown in FIG. 5, the solar cell section 14 is formed by sequentially laminating, from the front side, the cover glass 28, a layer of the sealing sheet 17, the solar cell 15 formed by twelve solar cells 31 distributed planarly, a layer of the sealing sheet 18, and the back surface member 13.

In the solar cell module 4 of the present embodiment, the solar cells 31 are not uniformly distributed, but are unevenly distributed closer to one long side of the cover glass 28 and the back surface member 13. Specifically, the solar cells 31 are arranged in two rows in a region on an eaves side of the cover glass 28 and the back surface member 13. In a region on the ridge side of the solar cell section 14, there is no solar cell 31, and the cover glass 28 and the back surface member 13 are merely layered.

In the present embodiment, the solar cells 31 are planarly arranged at a small interval equal to or less than a predetermined distance. The solar cells 31 may also be densely arranged. That is, adjacent crystalline solar cells may be arranged to be in contact with each other.

Hereinafter, a region on the eaves side where the solar cells 31 of the solar cell section 14 are sealed is referred to as a cell installation region 20. Further, a region on the ridge side where there is no solar cell 31 of the solar cell section 14 is referred to as an outer region (surplus region) 21.

The cell installation region 20 is a region where the solar cells 31 are planarly arranged at a small interval equal to or less than a predetermined distance, or are arranged with adjacent crystalline solar cells being in contact with each other.

The "surplus region" is a part other than the cell installation region 20 described above in the solar cell section 14. In the present embodiment, a rectangular region L4 on the ridge side is the "surplus region". A gap between the solar cells 31 is not the "surplus region". A gap between the solar cells 31 and a horizontal end of the solar cell section 14, and a gap between the solar cells 31 and an eaves-direction end of the solar cell section 14 are not the "surplus region".

In the present embodiment, the "surplus region" leaves a space allowing a solar cell 31 to be newly arranged.

The solar cell section 14 adopted in this embodiment is partitioned into the cell installation region 20 located on the eaves side and the outer region (surplus region) 21 located on the ridge side.

The cell installation region 20 is a part occupying more than a half of a plane of the solar cell section 14. Further, a range of about 70% to 90% of a length in the eaves-ridge direction from an eaves side end is the cell installation region 20.

The outer region 21 is a part from the ridge side end of the cell installation region 20 to the ridge side end of the solar cell section 14, in the plane of the solar cell section 14. More specifically, a range of about 10% to 30% of the length in the eaves-ridge direction from the ridge side end of the solar cell section 14 is the outer region (surplus region) 21.

That is, as shown in 4, a length L3 in the eaves-ridge direction of the cell installation region 20 is longer than a length L4 in the eaves-ridge direction of the outer region 21. In the present embodiment, the length L3 in the eaves-ridge direction of the cell installation region 20 is about 86% of the length (L3+L4) in the eaves-ridge direction of the solar cell section 14, while an area of the outer region 21 is about 17% of an area of the cell installation region 20.

In the cell installation region 20 of the back surface member 13 and the sealing sheet 18, as shown in FIG. 5, a lead insertion hole 23 is provided. The lead insertion hole 23 is a through hole penetrating the back surface member 13 and the like in the thickness direction.

The lead wire insertion hole 23 of the back surface member 13 and the like is a hole for inserting a cable (not shown) externally extending from the solar cell section 14. The lead insertion hole 23 is formed on a slightly lower side with respect to the ridge side end of the cell installation region 20 and near the center in the width direction.

In the outer region 21 of the solar cell section 14, a fastening element insertion hole 24 (through hole) is provided. The fastening element insertion hole 24 is a hole for inserting a fastening element (described in detail below) and formed on a slightly ridge side with respect to the eaves side end of the outer region 21. More specifically, the outer region 21 includes three fastening element insertion holes 24 which are formed at the same position in the eaves-ridge direction. The three fastening element insertion holes 24 are arranged side by side at predetermined intervals in the width direction. One of the three fastening element insertion holes 24 is formed at the center (or near the center) the width direction of the solar cell section 14. The other two fastening element insertion holes 24 are respectively formed at a position slightly separated toward the center from one side end in the width direction of the solar cell section 14 and a position slightly separated toward the center from the other side end in the width direction. All the fastening element insertion holes 24 are through holes having a circular opening shape.

In the solar cell section 14, a plurality of solar cells 31 are sandwiched between the cover glass 28 (front side transparent plate) and the back surface member 13, and these plurality of solar cells 31 are electrically connected in series by a conducting wire (not shown).

Further, the solar cell section 14 is connected to a terminal box (described below) and capable of extracting generated power to the outside.

In the solar cell section 14, a front face (upper face) of the cover glass 28 serves as a light receiving surface, and light transmitted through the cover glass 28 reaches the solar cells 31 to generate power.

As will be described later, the decorative glass 16 as the step forming plate is overlaid on the solar cell section 14. An area of the decorative glass 16 is smaller than an area of the solar cell section 14, and the decorative glass 16 is overlaid at a position close to the ridge side of the solar cell section 14. Therefore, on the eaves side of the solar cell section 14, the decorative glass 16 is not placed and the surface of the solar cell section 14 is exposed. On the other hand, on the ridge side of the solar cell section 14, the surface of the solar cell section 14 is not exposed since the decorative glass 16 is placed.

As described above, the solar cells 31 are not uniformly distributed, but are distributed unevenly in the cell installation region 20 on the eaves side. The decorative glass 16 is placed on a part of the cell installation region 20 to cover the part of the cell installation region 20.

Therefore, in the cell installation region 20 of the solar cell section 14, there are a part Where the surface is directly exposed as shown in FIG. 4, and a part covered with the decorative glass 16.

Therefore, in the cell installation region 20 of the solar cell section 14, there are an exposed region 34 located on the eaves side, and a transmitted light receiving region 35 located on the ridge side.

The exposed region 34 of the solar cell section 14 is a part from the eaves side end to near the center in the eaves-ridge direction, in the cell installation region 20 of the solar cell section 14. More specifically, the entire width direction area (the entire horizontal direction area) of this part corresponds to the exposed region 34.

The exposed region 34 of the solar cell section 14 is surface-treated as shown in FIG. 4, so that the appearance of the exposed region 34 is extremely similar to the appearance of the slate tile 3. The surface treatment will be described in detail below.

The transmitted light receiving region 35 of the solar cell section 14 is a part from the ridge side end of the exposed region 34 to the solar cell section 14, in the plane of the solar cell section 14. More specifically, the entire width direction area (the entire horizontal direction area) of this part corresponds to the transmitted light receiving region 35.

Next, the decorative glass 16 placed on the solar cell section 14 will be described.

The decorative glass 16 is a member that serves as the step forming plate. The decorative glass 16 is a glass member which has a substantially rectangular plate-like outer shape and has a substantially quadrangular shape in plan view. A front face of the decorative glass 16 is separated into an eaves side region 44 and a ridge side region 45. A length of the decorative glass 16 in the width direction (horizontal direction) is equal to a length of the solar cell section 14. A length of the decorative glass 16 in the eaves-ridge direction is shorter than the length of the solar cell section 14.

The eaves side region 44 is a part that is located on the upper side of the transmitted light receiving region 35 in the solar cell section 14 when assembled. The eaves side region 44 is also surface-treated, so that the appearance thereof is extremely similar to the appearance of the slate tile 3. This surface treatment will also be described in detail below.

The ridge side region 45 of the decorative glass 16 is a part located on the upper side of the outer region (surplus region) 21 of the solar cell section 14 when assembled as the solar cell module 4. Three bushing insertion holes 48 are provided in the decorative glass 16. All the bushing insertion holes 48 are through holes that have a circular opening shape and penetrate the decorative glass 16 in the thickness direction. The three bushing insertion holes 48 are located at the same position in the eaves-ridge direction, and arranged side by side at predetermined intervals in the width direction. One of the bushing insertion holes 48 is formed at the center (or near the center) in the width direction of the decorative glass 16. The other two bushing insertion holes 48 are respectively formed at a position that is off to one side end from the center in the width direction and a position that is off to the other side end from the center in the width direction.

Figure 3:
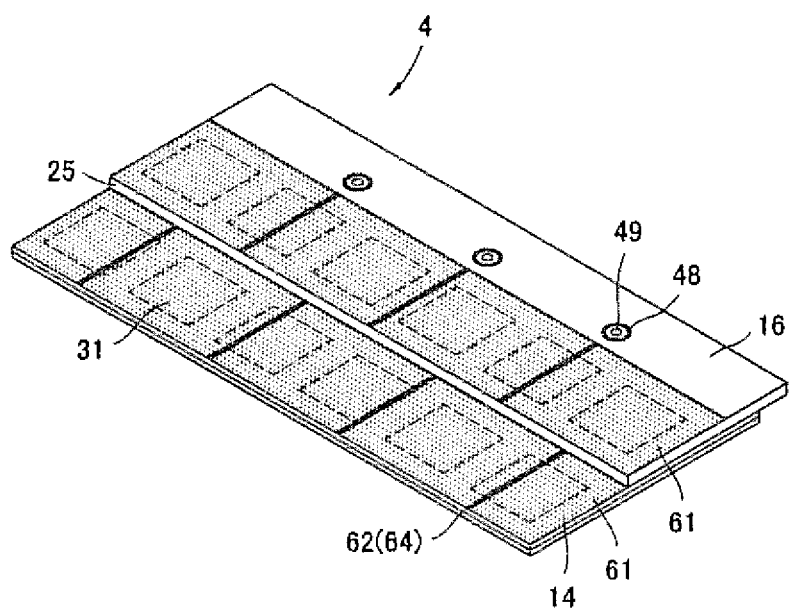
FIG. 3 is a perspective view of a solar cell module to be adopted in the roof structure of FIG. 1.

As illustrated in FIG. 3, the solar cell module 4 is formed by fitting a bushing member 49 (buffer member) into the bushing insertion hole 48.

Next, the bushing member 49 will be described. The bushing member 49 is a tubular member made of a plastic material. As illustrated in FIGS. 4, 5, 6A, and 6B, the bushing member 49 includes a flange part 70 located on an upper side and a cylindrical part 71 located on a lower side, and the flange part 70 and the cylindrical part 71 are integrated together.

Figure 6A:
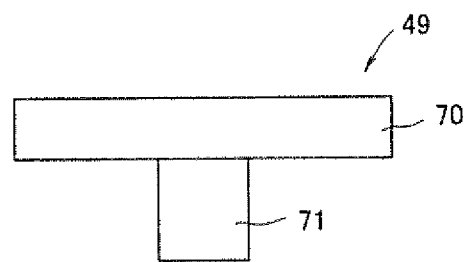
Figure 6B:
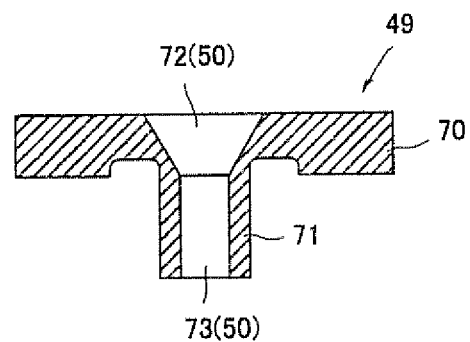

The flange part 70 corresponds to a head part of the bushing member 49. The flange part 70 is a part having a substantially discoid outer shape, and as illustrated in FIGS. 6A and 6B, the central part of the flange part 70 is formed to have an upper through hole 72 that penetrates the flange part 70 in the thickness direction. The upper through hole 72 is a substantially conical through hole with its diameter reduced toward the lower side, and is formed such that the central axis of the upper through hole 72 is located at the center of the flange part 70 (the center of the bushing member 49).

The cylindrical part 71 of the bushing member 49 is a part protruding downward from a lower face of the flange part 70 and includes a lower through hole 73 formed at the central part thereof. The lower through hole 73 is formed such that the central axis thereof is located at the center of the cylindrical part 71 (the center of the bushing member 49), to be a through hole extending in the longitudinal direction of the cylindrical part 71.

The upper through hole 72 of the flange part 70 and the lower through hole 73 of the cylindrical part 71 are continuous with each other in the up-down direction, to form a fastening element insertion hole 50 which is an integrated through hole. The fastening element insertion hole 50 is a through hole extending in the up-down direction, which is a hole having openings on an upper end face and a lower end face of the bushing member 49. That is, the fastening element insertion hole 50 is a through hole that penetrates the entire bushing member 49 in the thickness direction. The bushing member 49 is a tubular member having a through hole that penetrates the whole.

Figure 7A:
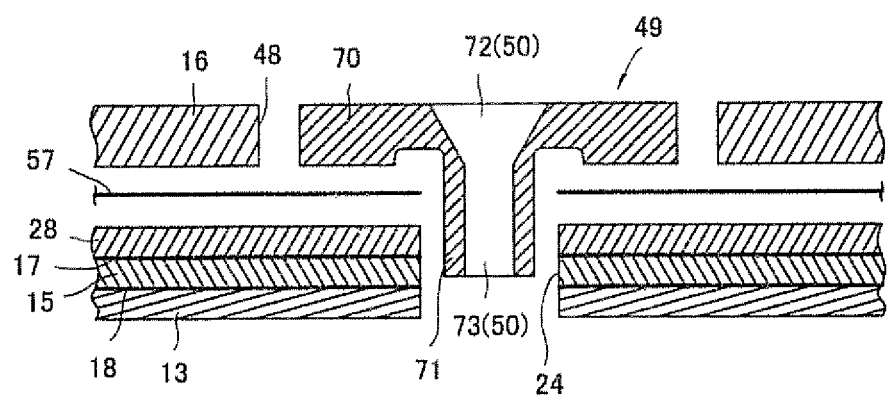
Figure 7B:
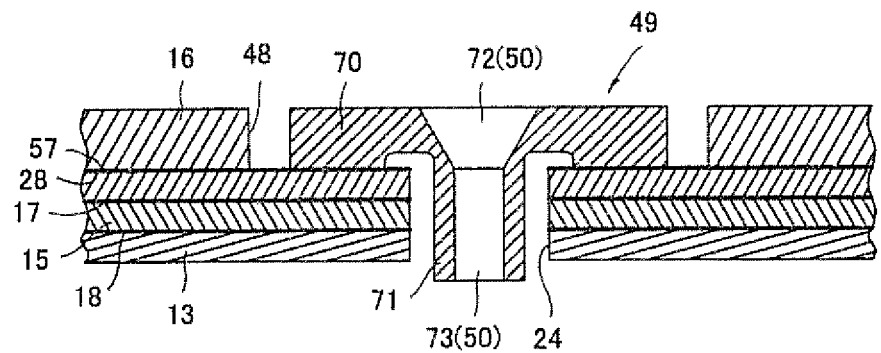

In the solar cell module 4, the decorative glass 16 (step forming plate) is integrally placed on the solar cell section 14. In this embodiment, as shown in FIGS. 5, 7A, and 7B, the decorative glass 16 is bonded to the solar cell section 14 via a layer of a decorative glass EVA sheet 57. The decorative glass EVA sheet layer is a melted decorative glass EVA sheet 57, and is an adhesive layer.

As described above, the area of the decorative glass 16 is smaller than the area of the solar cell section 14, and the decorative glass 16 is overlaid at a position close to the ridge side of the solar cell section 14. Therefore, the decorative glass 16 as the step forming plate is installed on the front side of the cover glass (front side transparent plate) 28 of the solar cell section 14, in a state of overlapping with a part of the cover glass 28. Specifically, the decorative glass 16 covers a part of the transmitted light receiving region 35 of the solar cell section 14, and covers substantially all of the outer region (surplus region) 21. There is no decorative glass 16 on the exposed region 34 of the solar cell section 14.

Therefore, there is a step 25 between the solar cell section 14 and the decorative glass 16.

In a state in which the decorative glass 16 is fixed on the solar cell section 14, the fastening element insertion hole 24 of the solar cell section 14 communicates with the bushing insertion hole 48 of the decorative glass 16. Then, the bushing member 49 (buffer member) is attached to this communicating hole.

The bushing member 49 is integrally fixed to the decorative glass 16 and the solar cell section 14 via the decorative glass EVA sheet 57.

The bushing member 49 is embedded in the solar cell section 14 and the decorative glass 16, and the flange part 70 of the head part is buried in the decorative glass 16. Therefore, the bushing member 49 does not protrude to the front side of the solar cell module 4. Although a height of the surface of the head part (flange part 70) of the bushing member 49 is aligned with a height of the decorative glass 16 as the step forming plate in FIGS. 7A and 7B, the head part of the bushing member 49 may be lower in height than the surface of the decorative glass 1.

Two fastening element insertion holes 24 of the solar cell section 14 and the bushing insertion hole 48 of the decorative glass 16 overlap with each other with the central axes aligned. The two fastening element insertion holes 24 and the bushing insertion hole 48 form the continuous communicating hole. The two fastening element insertion holes 24 have a same hole diameter. A hole diameter of the bushing insertion hole 48 is larger than the hole diameter of the fastening element insertion holes 24.

Thus, at a time of manufacturing, when the bushing member 49 is disposed inside the bushing insertion hole 48, and the decorative glass 16 is placed on the upper side of the decorative glass EVA sheet 57, the flange part 70 of the head part of the bushing member 49 is located inside the bushing insertion hole 48 as illustrated in FIG. 7B. Further, the cylindrical part 71 is located inside the communicating hole formed by the two fastening element insertion holes 24. Further, the fastening element insertion hole 50 formed in the bushing member 49 is located inside the continuous communicating hole formed by the two fastening element insertion holes 24 and the bushing insertion holes 48.

The most part of the lower face of the flange part 70 of the bushing member 49, which is located inside the bushing insertion hole 48, is placed on the upper side of the solar cell section 14 and is in intimate contact with an upper face of the decorative glass EVA sheet 57. That is, the layer of the decorative glass EVA sheet 57 is interposed between the decorative glass 16 and the solar cell section 14, and between the flange part 70 and the solar cell section 14. Then, the decorative glass 16 and the flange part 70 each are integrally fixed to the solar cell section 14 by adhesive force of the decorative glass EVA sheet 57.

At a time of manufacturing the solar cell module 4, the bushing member 49 is disposed inside the bushing insertion hole 48, and the decorative glass 16 is placed on the upper side of the decorative glass EVA sheet 57, so that the decorative glass 16 and the flange part 70 each are integrally fixed to the solar cell section 14. That is, in the present embodiment, the bushing member 49 is fixed simultaneously with the lamination of the decorative glass 16 on the decorative glass EVA sheet 57.

In other words, when the decorative glass 16 is placed on the upper side of the solar cell section 14, a rear face side of the decorative glass 16 is laminated with the decorative glass EVA sheet (EVA sheet) 57. That is, the rear face side of the decorative glass 16 is laminated with the bushing member 49 disposed inside the bushing insertion hole 48, to integrally fix the bushing member 49 to the solar cell section 14.

In the bushing member 49, the diameter of the flange part 70 is sufficiently smaller than the inner diameter of the bushing insertion hole 48, and the diameter of the cylindrical part 71 is sufficiently smaller than the inner diameter of the two fastening element insertion holes 24. Thus, when the bushing member 49 is disposed inside the continuous communicating hole, which is formed by the bushing insertion hole 48 and the two fastening element insertion holes 24, a gap is formed between an inner peripheral surface of the communicating hole and the bushing member 49. This prevents the bushing member 49 from damaging the inner peripheral surface of the communicating hole when the bushing member 49 is inserted into the communicating hole.

More specifically, for example, a structure may be assumed such that the bushing member is slightly larger than the communicating hole and pushed into the communicating hole while being flexibly deformed. In this case, when the bushing member is pushed in, the inner peripheral surface of the communicating hole may be damaged by the application of force with the bushing member making contact with the inner peripheral surface of the communicating hole. On the other hand, in the present embodiment, the bushing member 49 is sufficiently smaller than the communicating hole so that the bushing member 49 is less likely to make contact with the inner peripheral surface of the communicating hole during the insertion of the bushing member 49. This prevents the bushing member 49 from damaging the inner peripheral surface of the communicating hole and from damaging the solar cell section 14, the decorative glass 16, and the like.

When the bushing member 49 is in a fixed state, as illustrated in FIG. 7B, a lower end of the bushing member 49 is located below a lower face of the back surface member 13. More specifically, the length of the cylindrical part 71 (the axial length of the bushing member 49) is longer than the total thickness of the solar cell section 14 and the layer of the decorative glass EVA sheet 57. A lower end part of the cylindrical part 71 protrudes downward from the lower end opening of the communicating hole formed by the bushing insertion hole 48 and the two fastening element insertion holes 24. This can prevent damage of the back surface member 13, and can stabilize the posture of the solar cell module 4 when the solar cell module 4 is fixed to the purlin member 2 (described in detail below).

Figure 8:
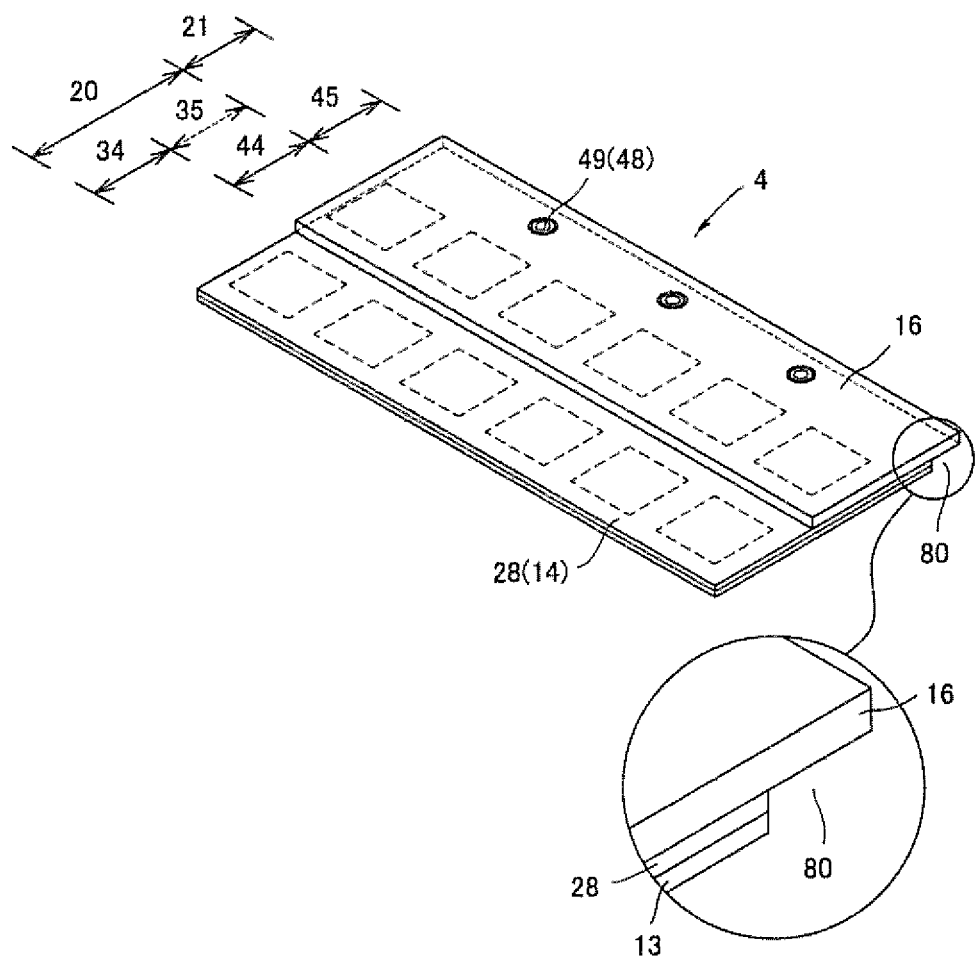
FIG. 8 is an explanatory view illustrating an assembly procedure of the solar cell module, and illustrating a state in which the decorative glass has been laminated on the solar cell section.

As shown in FIG. 8, the solar cell section 14 and the decorative glass 16 are integrally fixed. Further, the eaves side region 44 of the decorative glass 16 overlaps with the upper side of the transmitted light receiving region 35 located on the ridge side of the solar cell section 14.

Therefore, in the solar cell module 4, there is the step 25 between the solar cell section 14 and the decorative glass 16, and the appearance appears as if one slate tile 3 on top of which another slate tile 3 adjacent on the ridge side is placed.

The step 25 formed by the decorative glass 16 appears just like an end face of one slate tile overlapping on the ridge side of another slate tile 3.

The decorative glass 16 is located on the front side of the cover glass 28 of the solar cell section 14, and the eaves side region 44 of the decorative glass 16 overlaps on the upper side of the transmitted light receiving region 35 of the solar cell section 14. Further, the ridge side region 45 of the decorative glass 16 is located on the upper side of the outer region (surplus region) 21 of the solar cell section 14. In other words, the decorative glass 16 is disposed across the cell installation region 20 and the outer region 21 of the solar cell section 14, a part of the decorative glass 16 overlaps with a part of the cell installation region 20, and a remaining part protrudes from the cell installation region 20 to the ridge side. Further, a region in which the protruding part of the decorative glass 16 is located overlaps with the outer region 21 of the solar cell section 14.

The decorative glass 16 has a thickness enough to be recognized from a distance with the naked eye, and the thickness is equivalent to that of the slate tile 3. Therefore, there is formed the step 25 that can be recognized even from a distance, and the decorative glass 16 looks like a slate tile 3 overlapping on the eaves side.

Further, the area of the decorative glass 16 (an area of an upper face or a lower face) is smaller than the area of the cell installation region 20 of the solar cell section 14. The area of a part overlapping with the decorative glass 16, in the cell installation region 20, is approximately half (an integral division of) the area of the cell installation region 20.

The ridge side of the decorative glass 16 protrudes a little from the ridge side of the solar cell section 14. A space 80 is formed in a part located below the ridge side part of the decorative glass 16, and on the ridge side from the ridge side end of the solar cell section 14.

Accordingly, a step-like part is formed near the ridge side end of the solar cell module 4 on the rear face side thereof.

In the present embodiment, the exposed region 34 of the cover glass 28 and the eaves side region 44 of the decorative glass 16 are surface-treated, and the surface of this part is a minute uneven shape.

The surface treatment is performed with the decorative glass 16 attached to the solar cell section 14.

Figure 9:
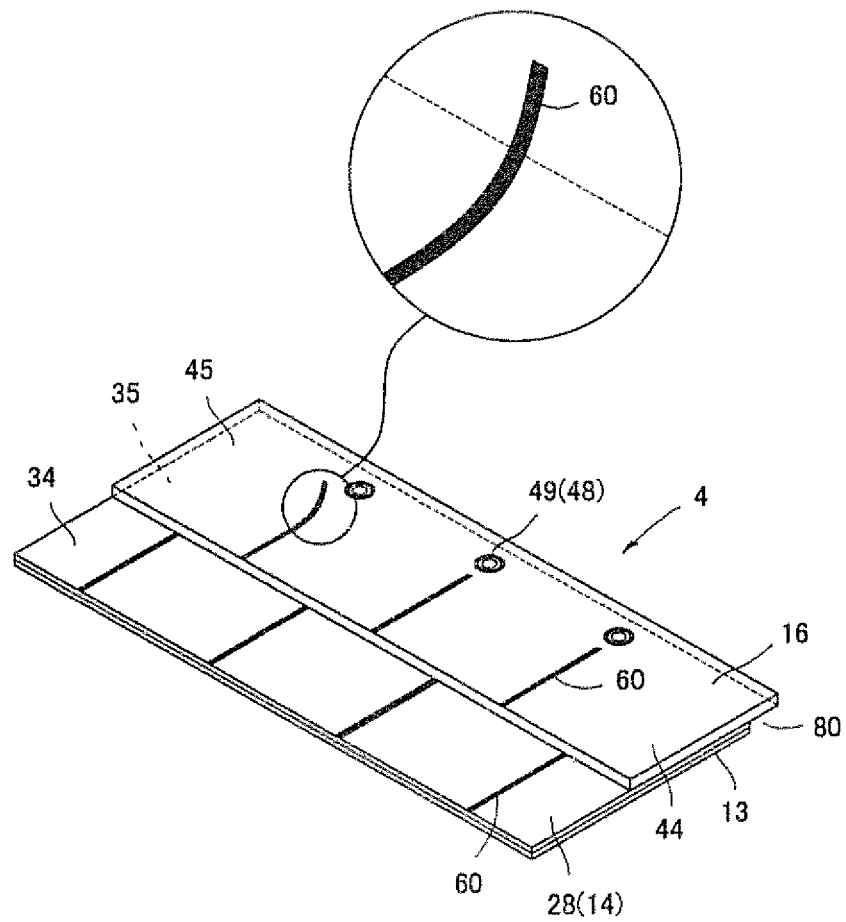
FIG. 9 is an explanatory view illustrating an assembly procedure of the solar cell module, and illustrating a state in which masking tapes are being stuck from the state of FIG. 8.

Specifically, as illustrated in FIG. 9, masking tapes 60 are firstly stuck to predetermined parts on a surface of the exposed region 34 of the cover glass 28, and a surface of the eaves side region 44 of the decorative glass 16. All the masking tapes 60 stuck to the respective parts linearly extend in the eaves-ridge direction.

Figure 10:
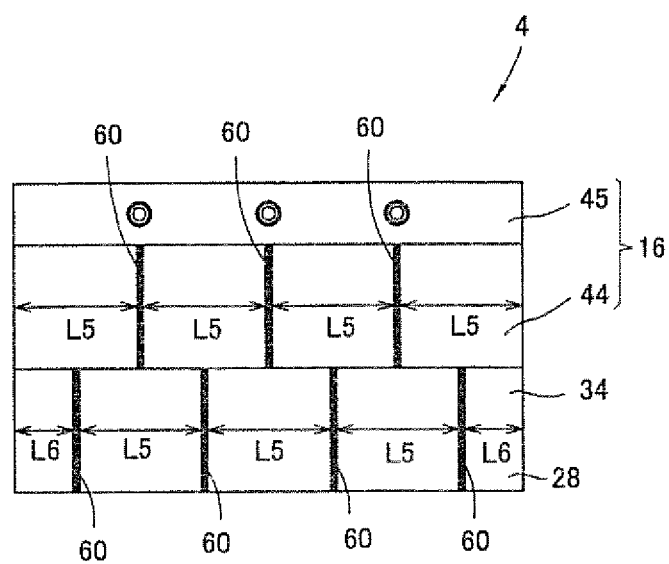
FIG. 10 is a schematic view illustrating a state in which the masking tapes have been stuck to a laminate body illustrated in FIG. 8.

As illustrated in FIG. 10, in the eaves side region 44 of the decorative glass 16, a first masking tape 60 is stuck to a position that is separated from one side end in the width direction by a predetermined distance L5. Further, a second masking tape 60 is stuck to a position that is separated from the first masking tape 60 by the predetermined distance L5 in the width direction, and a third masking tape 60 is stuck to a position that is separated from the second masking tape 60 by the predetermined distance L5 in the width direction. That is, in the eaves side region 44 of the decorative glass 16, a plurality of masking tapes 60 are arranged side by side at intervals of the predetermined distance L5. Further, in the eaves side region 44 of the decorative glass 16, the distance between the one side end in the width direction and the masking tape 60 that is closest to the one side end is also the predetermined distance L5, and the distance between the other side end and the masking tape 60 that is closest to the other side end is also the predetermined distance L5.

On the other hand, in the exposed region 34 of the cover glass 28, the distance between the masking tapes 60 is also the predetermined distance. However, in the exposed region 34 of the cover glass 28, the distance between one side end in the width direction and the masking tape 60 that is closest to the one side end, and the distance between the other side end and the masking tape 60 that is closest to the other side end are a distance L6, which differs from the predetermined distance L5. The distance L6 is approximately half the predetermined distance L5.

That is, in both the eaves side region 44 of the decorative glass 16 and the exposed region 34 of the cover glass 28, the plurality of masking tapes 60 are arranged side by side at intervals of the predetermined distance L5. However, the distance between the end in the width direction and the masking tape 60 that is closest to the end in either one of them is half the distance in the other one. Accordingly, a row of the masking tapes 60 formed in the eaves side region 44 of the decorative glass 16 and a row of the masking tapes 60 formed in the exposed region 34 of the cover glass 28 are shifted from each other by a distance of half the arrangement interval in the width direction of the eaves side region 44 of the decorative glass 16 and the exposed region 34 of the cover glass 28.

The surface treatment is performed in such a manner that sandblast is applied to the surface of the eaves side region 44 of the decorative glass 16 and the surface of the exposed region 34 of the cover glass 28 with the masking tapes 60 stuck in this manner, and a coating agent is then applied. Then, the masking tapes 60 are peeled off to complete the solar cell module 4 as illustrated in FIG. 3.

When the surface treatment is performed, the color and the texture (surface roughness) of the surface of the surface-treated part become extremely similar to those of the slate tile 3. That is, in the present embodiment, a treatment for roughening a smooth glass surface is performed to form the surface similar to the surface of the slate tile 3 formed by cutting a natural rock. Accordingly, the appearance of the solar cell module 4 and the appearance of the slate tile 3 are difficult to distinguish when laid on the roof. Thus, it is possible to create a beautiful appearance having a sense of unity on the entire roof (described in detail below).

When the glass surface is roughened, although the glass surface can be brought into a surface similar to the surface of the slate tile 3, dust and dirt are prone to enter asperities on the glass surface. Thus, in the present embodiment, a coating agent is applied after sandblast to make the roughened glass surface get less dirty.

Further, the entire solar cell section 14 looks blackish before the surface treatment. As illustrated in FIG. 8, when the decorative glass 16 is placed on the solar cell section 14, the solar cell section 14 below the decorative glass 16 is seen through even in a part where the decorative glass 16 is located, since the decorative glass 16 is transparent. That is, since a part of the solar cell section 14 indicated by a dashed line in FIG. 8 is seen through, an eaves side part (eaves side region 44) of the decorative glass 16 also looks blackish.

The part to which the masking tape 60 is stuck is not surface-treated. Thus, such a part looks blackish as before, even after the surface treatment. Thus, as illustrated in FIG. 3, a part 64 that looks black in a line shape is formed on the surface of the eaves side region 44 of the decorative glass 16 and the surface of the exposed region 34 of the cover glass 28.

That is, a roughened part 61 which is roughened and a smooth part 62 which keeps smoothness are formed on the surface of the eaves side region 44 of the decorative glass 16 and the surface of the exposed region 34 of the cover glass 28. The smooth part 62 looks blackish and thus looks like a black line extending in the eaves-ridge direction. This part 64 that looks black in a line shape appears to be a boundary of the slate tiles 3 arranged side by side in parallel.

The total area of the solar cell section 14 is 1.17 times of the area of the cell installation region 20 of the solar cell section 14. The area of the surplus region is 17% of the area of the upper face of the cover glass 28. The total area of the solar cell section 14 may be 1.1 times or more to 4 times or less of the area of the cell installation region 20. The area of the surplus region may be 10% or more and 300% or less of the area of the upper face of the cover glass 28.

The solar cell module 4 of the present embodiment and the slate tile (non-functional tile material) 3 described above are laid in a same roof form.

Here, an appearance of the solar cell module 4 and the slate tile 3 will be described.

The solar cell module 4 is made to imitate a shape of overlapped slate tiles 3.

Figure 12:
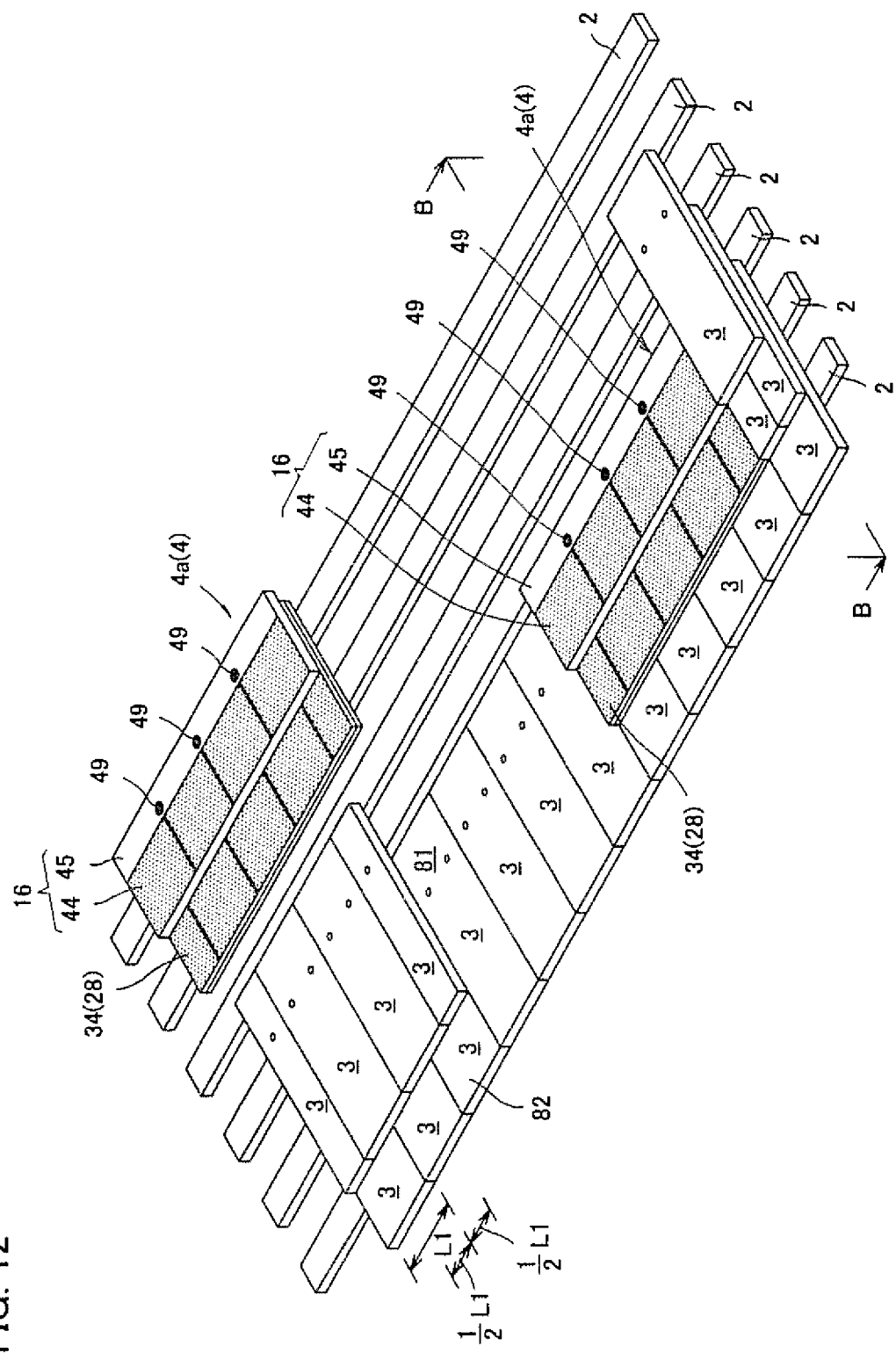
FIG. 12 is a perspective view illustrating a state in which slate tiles of an eaves side second stage and the solar cell modules are being attached following FIG. 11.

Here, as shown in FIG. 12, the slate tile 3 is laid with a part thereof overlapping with another slate tile 3 adjacent in the ridge direction. Therefore, as shown in FIGS. 12 and 2, the slate tile 3 when laid has an overlapping part 81 that overlaps with another slate tile 3 adjacent in the ridge direction, and an exposed part 82 where the slate tile 3 itself is exposed.

In the solar cell module 4 of the present embodiment, the exposed region 34 of the solar cell section 14 is made to resemble the exposed part 82 of the slate tile 3.

The exposed region 34 of the solar cell section 14 is the cover glass (front side transparent plate) 28 of the solar cell module 4, and is the front side transparent plate exposed region not overlapping with the decorative glass 16 (step forming plate). In order to make the width in the eaves-ridge direction of the front side transparent plate exposed region resemble the exposed part 82 of the slate tile 3, the width is made substantially equal to the width of the exposed part 82 of the slate tile 3. That is, the width in the eaves-ridge direction of the exposed region 34 of the solar cell section 14 is substantially equal to the width in the eaves-ridge direction of the exposed part 82 of the slate tile 3.

That is, a difference between these widths is 3 cm or less, more desirably 3 cm or less. When laid on a roof and viewed from the ground, the difference between the widths is hardly recognized.

Further, in the solar cell module 4 of the present embodiment, the eaves side region 44 of the decorative glass 16 is made to resemble the exposed part 82 of the slate tile 3.

The eaves side region 44 of the decorative glass (step forming plate) 16 is a part of the decorative glass 16, and is a step forming plate exposed region not overlapping with another solar cell module. Then, in order to make the width in the eaves-ridge direction of the step forming plate exposed region resemble the exposed part 82 of the slate tile 3, the width is made substantially equal to the width of the exposed part 82 of the slate tile 3. That is, the width in the eaves-ridge direction of the eaves side region 44 of the decorative glass 16 is substantially equal to the width in the eaves-ridge direction of the exposed part 82 of the slate tile 3.

A difference between these widths is also 3 cm or less, more desirably 3 cm or less. When laid on a roof and viewed from the ground, the difference between the widths is hardly recognized.

Further, the horizontal width of the part 64 that looks black in a line shape of the solar cell module 4 is equal to the horizontal width of the slate tile 3.

A color of a part to be exposed on the surface of the solar cell module 4 when laid on the roof is a color close to the slate tile 3.

Therefore, the appearance of the solar cell module 4 in a state laid on the roof is similar to that of the slate tile 3.

Then, a construction method of the roof structure 1 of the present embodiment will be described.

Figure 11:
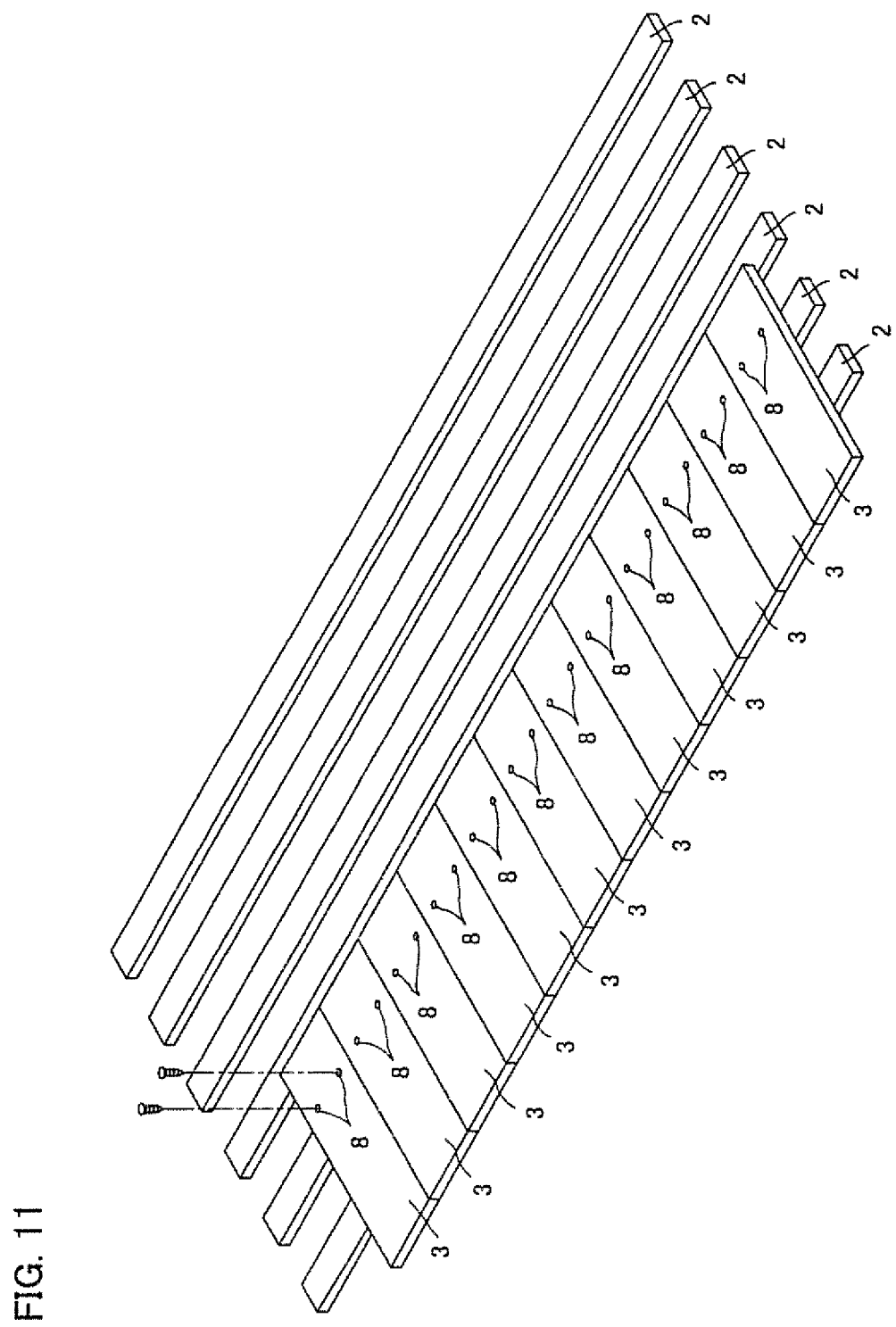
FIG. 11 is a perspective view illustrating a construction procedure of the roof structure of the present embodiment, and illustrating a state in which slate tiles of an eaves side first stage have been attached.

First, as illustrated in FIG. 11, slate tiles 3 of the eaves side first stage are fixed. That is, the attachment hole 8 of each of the slate tiles 3 is brought to overlap with the purlin member 2, and a fastening element such as a wood screw or a nail is inserted into the attachment hole 8, to integrally fix the slate tile 3 and the purlin member 2 to each other. Accordingly, a plurality of slate tiles 3 are arranged side by side with no gap therebetween in the horizontal direction at the eaves side end of the roof.

The fastening element is a superordinate concept of a screw and a nail.

The slate tile 3 is a non-functional tile material having no power generating function.

Next, as illustrated in FIG. 12, slate tiles 3 of the eaves side second stage are fixed. Each of the slate tiles 3 of the eaves side second stage is also integrally fixed to the purlin member 2 by inserting a fastening element into the attachment hole 8 similarly to the slate tiles 3 of the eaves side first stage.

The ridge side part of the slate tile 3 of the eaves side first stage overlaps with the eaves side part of the slate tile 3 of the eaves side second stage. More specifically, the slate tile 3 belonging to the eaves side second stage is placed on a part including a boundary between adjacent slate tiles of the eaves side first stage with its center near the boundary while the ridge side of the slate tile 3 belonging to the eaves side first stage overlapping with the eaves side of the slate tile 3 belonging to the eaves side second stage.

At this point, the attachment hole 8 of the slate tile 3 arranged on the eaves side first stage is covered with the slate tile 3 arranged on the eaves side second stage.

More specifically, one slate tile 3 which is arranged on the eaves side second stage covers one of the two attachment holes 8 formed on one of the two slate tiles 3 which are adjacent to each other on the eaves side first stage and one of the two attachment holes 8 formed on the other slate tile 3. More specifically, in the attachment holes 8 formed on each of the slate tiles 3, the attachment hole 8 that is closest to the boundary between the two slate tiles 3 is covered with the slate tile 3 of the eaves side second stage.

That is, the slate tiles 3 of the eaves side second stage are laid at positions shifted by half the tile width L1 (refer to FIG. 2) in the width direction with respect to the slate tiles 3 of the eaves side first stage. That is, in the most part of the roof structure 1 of the present embodiment, the slate tiles 3 are laid at positions shifted in the width direction between adjacent stages. In other words, in the roof structure 1 of the present embodiment, a plurality of slate tiles 3 are arranged in a step-like and staggered form.

Thus, the ridge side part of the slate tile 3 of the first stage located between the width direction center and an end at one side overlaps with the eaves side part of the slate tile 3 of the second stage located between the width direction center and an end at the other side.

Thereafter, slate tiles 3 of the eaves side third and later stages are fixed in the same manner.

Then, the solar cell module 4 is fixed so as to be arranged side by side with the slate tiles 3 of the eaves side second stage and the eaves side third stage.

More specifically, as illustrated in FIG. 12, the solar cell module 4 is fixed in such a manner that the exposed region 34 of the cover glass 28 of the solar cell section 14 in the solar cell module 4 is arranged side by side with the exposed part of the slate tile 3 of the eaves side second stage in the width direction (horizontal direction), and the eaves side region 44 of the decorative glass 16 of the solar cell module 4 is arranged side by side with the exposed part of the slate tile 3 of the eaves side third stage in the width direction (horizontal direction).

Figure 13:
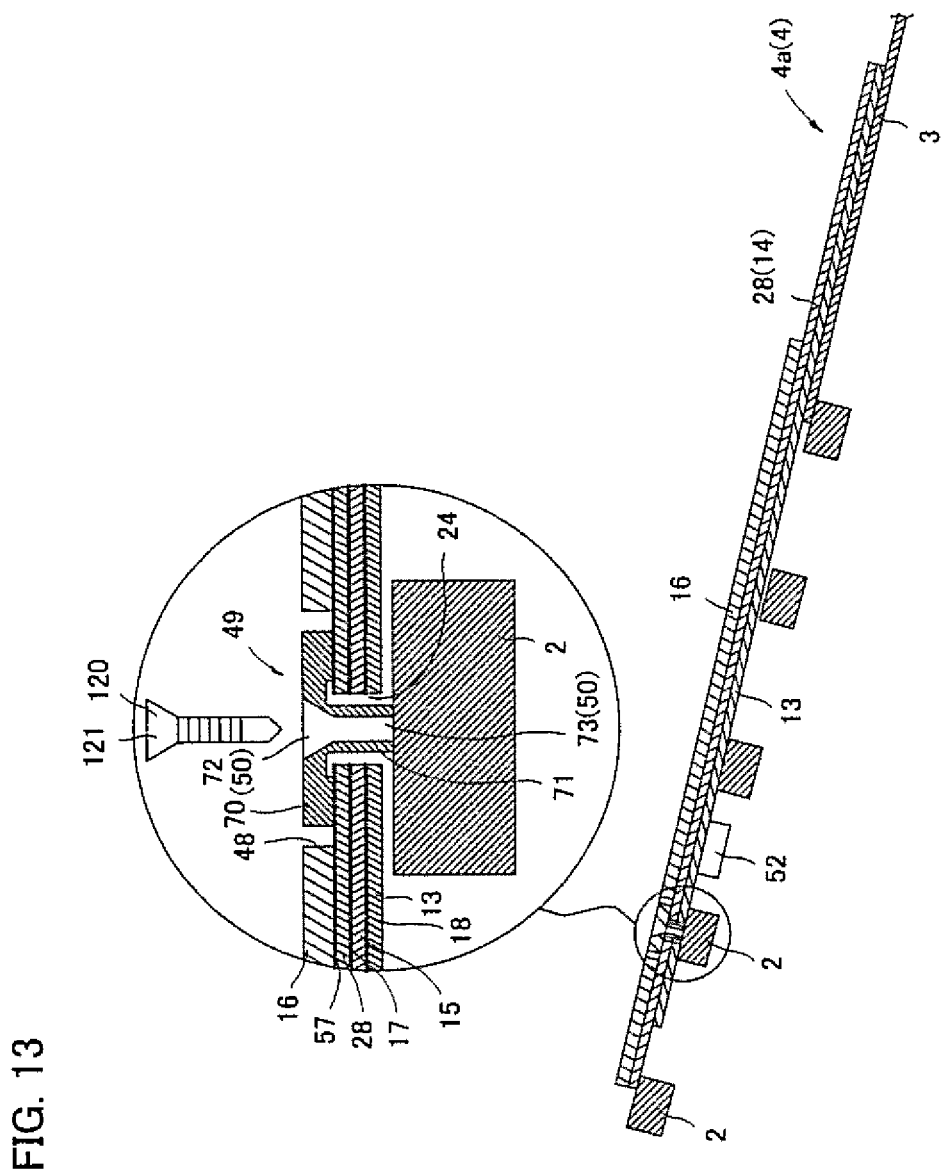
FIG. 13 is a B-B sectional view illustrating the roof structure in the state illustrated in FIG. 12, and a sectional view illustrating only a principal part in an enlarged manner.

As described above, in the solar cell module 4, the two fastening element insertion holes 24 and the bushing insertion holes 48 communicate with each other to form the continuous communicating hole, and the bushing member 49 is fixed inside the communicating hole (refer to FIG. 9, for example). That is, as illustrated also in FIG. 13, the bushing member 49 is fixed inside the communicating hole which penetrates the solar cell module 4 in the thickness direction.

Figure 14A:
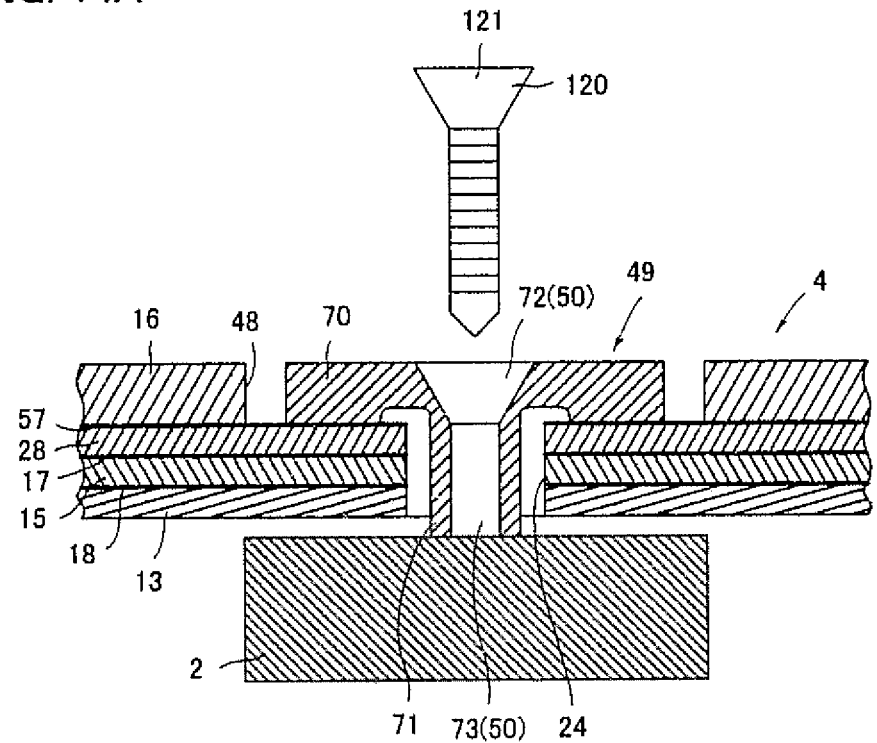
Figure 14B:
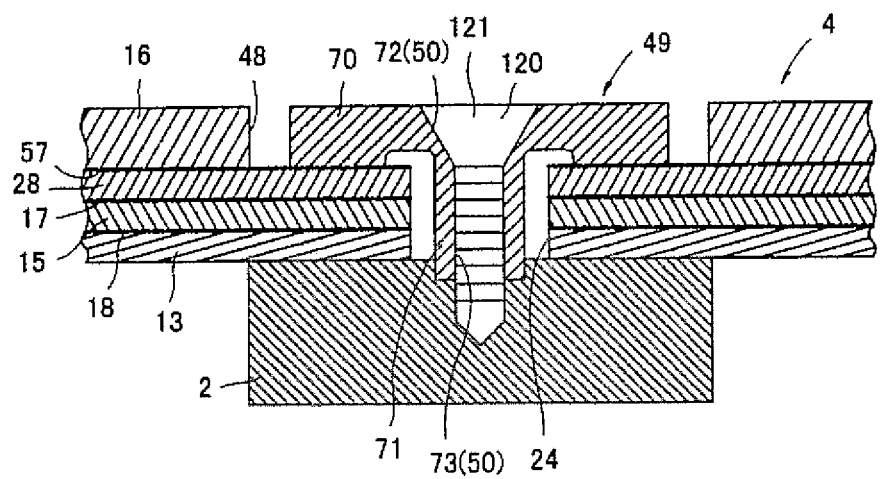

When the solar cell module 4 is fixed, a fastening element 129 is inserted into the fastening element insertion hole 50 of the bushing member 49. That is, as illustrated in FIGS. 14A and 14B, the fastening element 120 such as a screw or a nail is inserted into the fastening element insertion hole 50, so that a head part 121 of the fastening element 120 is located inside an upper through hole 72 and a shaft part thereof is located inside a lower through hole 73. Accordingly, the solar cell module 4 and the purlin member 2 are integrally fixed.

More specifically, as described above, the lower end of the bushing member 49 protrudes downward from a lower opening of the communicating hole formed by the two fastening element insertion holes 24 and the bushing insertion holes 48, In other words, a part on a tip side in a protruding direction of the cylindrical part 71 slightly protrudes downward from the lower face of the back surface member 13. Thus, when the solar cell module 4 is placed on the upper side of the purlin member 2, as illustrated in FIG. 14A, the lower end of the bushing member 49 comes into contact with an upper face of the purlin member 2, and the rear face of the back surface member 13 is arranged at a position separated upward from the purlin member 2.

When the fastening element is inserted into the fastening element insertion hole 50 in this state, as illustrated in FIG. 14B, the lower end part of the fastening element protruding from the lower opening of the fastening element insertion hole 50 enters inside the purlin member 2. Along with this, a lower face of the solar cell module 4, that is, the lower face of the back surface member 13 comes into contact with the upper face of the purlin member 2. At this time, the lower end part of the bushing member 49 protruding downward from the lower opening of the communicating hole sinks into the purlin member 2. That is, the bushing member 49 is pushed against the purlin member 2 to form a recess on the purlin member 2, and the lower end part of the bushing member 49 enters the recess.

With such a configuration, an impact produced by the screw-in (or the drive-in) of the fastening element is less likely to be transmitted to the back surface member 13, unlike the case in which the fastening element is screwed in or driven in) with the lower face of the back surface member 13 being in contact with the upper face of the purlin member 2. Thus, damage of glass that is produced during the fixing operation of the solar cell module 4 can be reduced.

Further, in addition to the fastening element, the lower end of the bushing member 49 is sunk into the purlin member 2, which enables the solar cell module 4 to be more stabilized during the fixing operation. That is, the solar cell module 4 and the purlin member 2 can be more firmly fixed to each other.

According to the solar cell module 4 of the present embodiment, the head part 121 of the fastening element 120 is buried in the decorative glass 16 and does not protrude over the solar cell module 4.

As described above, the head part of the bushing member 49 is buried in the decorative glass 1, and a depth and a diameter of the upper through hole 72 are larger than those of the head part 121 of the fastening element 120. Therefore, the head part 121 of the fastening element 120 is concealed by the decorative glass 16 and does not protrude over the solar cell module 4.

The solar cell module 4 of the present embodiment can be fixed onto the roof by completely the same method as the fixing method of the slate tile 3 in such a manner that the attachment hole is brought to overlap with the purlin member 2 and the fastening element is inserted into the attachment hole. That is, it is not necessary to perform a dedicated operation for attaching the solar cell module 4 such as fixing attachment metal fittings to the purlin member 2 and the slate tile 3. Thus, a fixing operation onto the roof is easily performed.

The solar cell module 4 of the present embodiment is fixed in such a manner that the bushing member 49 is previously disposed inside the communicating hole formed by the two fastening element insertion holes 24 and the bushing insertion hole 48, and the fastening element is inserted into the fastening element insertion hole 50 of the bushing member 49. Accordingly, when the fastening element is screwed in (or pushed in), the tip part of the fastening element makes no contact with the inner peripheral surface of the fastening element insertion hole 24, which prevents damage of the inner peripheral surface of the fastening element insertion hole 24.

Figure 15:
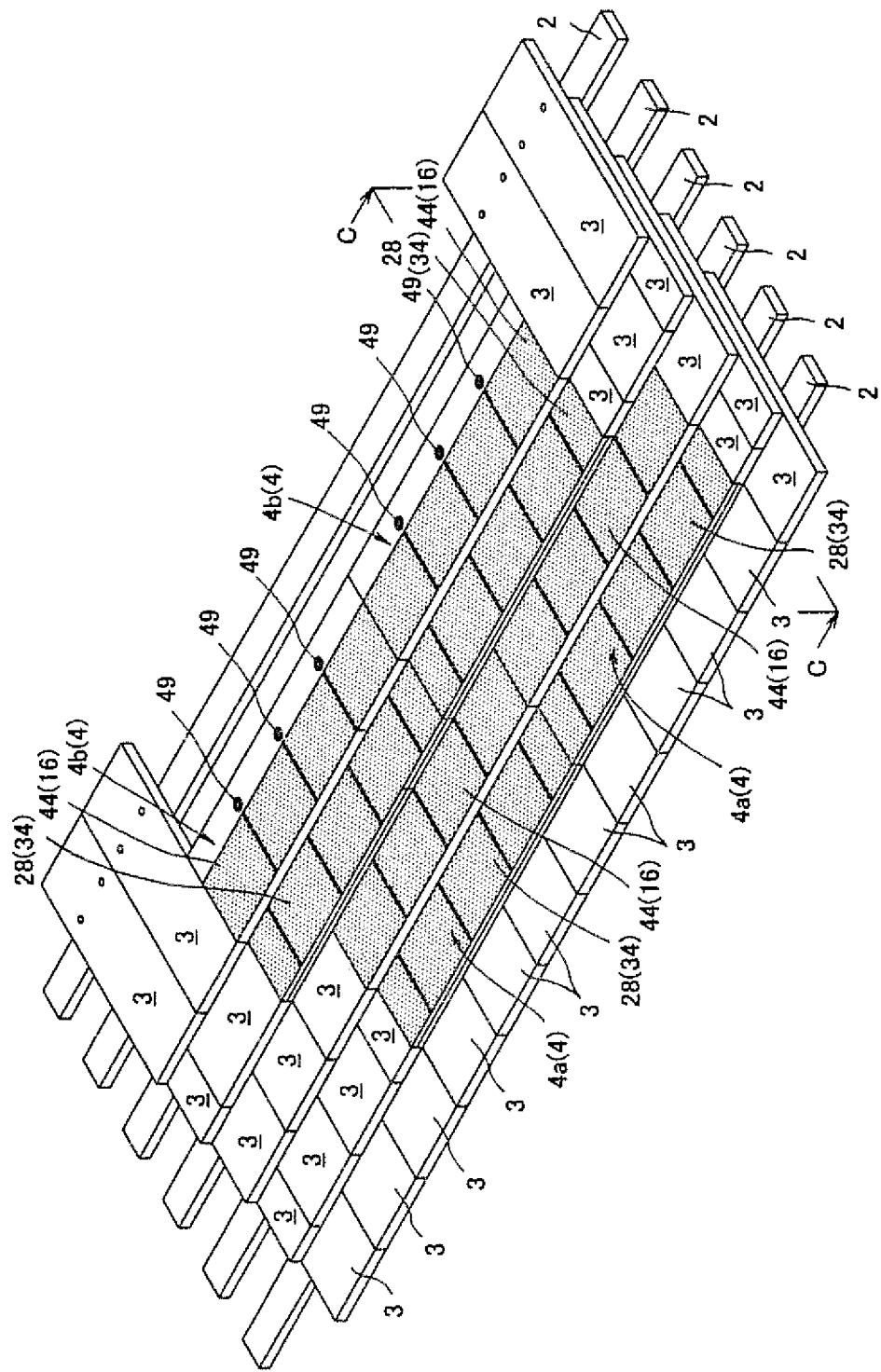
FIG. 15 is a perspective view illustrating a state in which slate tiles of an eaves side third stage and the solar cell modules of upper stages are being attached following FIG. 12.

Then, as illustrated in FIG. 15, another solar cell module 4 is additionally fixed on a further upper stage of the fixed solar cell module 4.

At this time, an upper stage solar cell module 4b is fixed at a position that is shifted by the width dimension L1 (refer to FIG. 2) of the slate tile 3 in the horizontal direction (the width direction of the solar cell module 4) with respect to a lower stage solar cell module 4a.

The upper stage solar cell module 4b and the slate tile 3 of the eaves side third stage overlap with the upper side of a part located on the ridge side with respect to the eaves side region 44 (refer to FIG. 3) of the decorative glass 16, in the lower stage solar cell module 4a.

First, a part overlapping with the upper stage solar cell module 4b will be described.

Figure 16:
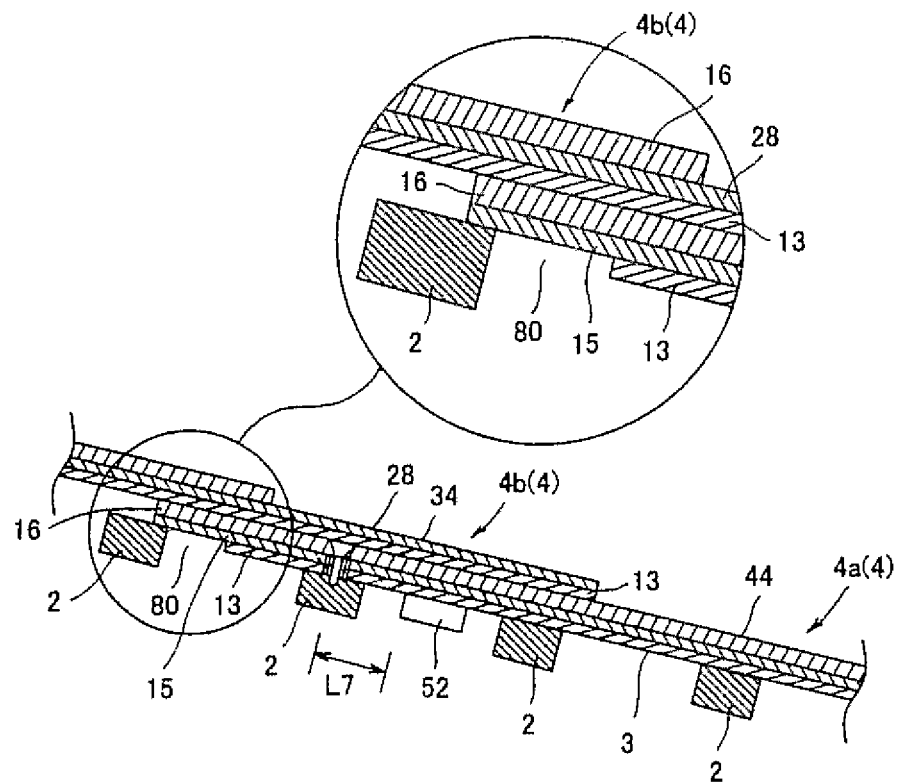
FIG. 16 is a C-C sectional view of the roof structure in the state illustrated in FIG. 15, and a sectional view illustrating only a principal part in an enlarged manner.

As illustrated in FIGS. 15 and 16, the eaves side part of the upper stage solar cell module 4b overlaps with an upper side of the ridge side region 45 of the decorative glass 16 of the lower stage solar cell module 4a. In other words, the lower stage solar cell module 4a and the upper stage solar cell module 4b overlap with each other in a shifted state in the eaves-ridge direction so that a line on the eaves side end in the ridge side region 45 of the lower stage solar cell module 4a entirely overlaps with the upper stage solar cell module 4b.

Accordingly, as illustrated in FIG. 16, the upper side of the communicating hole in which the bushing member 49 is located and into which the fastening element 120 is inserted is covered with the eaves side part of the upper stage solar cell module 4b.

Then, a part in which the slate tile 3 overlaps with the upper side of the ridge side region 45 of the decorative glass 16 of the lower stage solar cell module 4a will be described. Also in this case, the upper side of the communicating hole into which the fastening element 120 is inserted is covered with the slate tile 3, similarly to the case in which the upper stage solar cell module 4b overlaps with the upper side of the ridge side region 45 (FIG. 15).

In the solar cell module 4 of the present embodiment, as illustrated in FIG. 16, the terminal box 52 is fixed to a rear face side of the back surface member 13. More specifically, the terminal box 52 is fixed in such a manner that the ridge side end of the terminal box 52 is located at a position separated by a predetermined distance L7 to the eaves side from the center of the communicating hole into which the fastening element is inserted. Further, the terminal box 52 protrudes downward from the rear face of the back surface member 13.

The solar cell module 4 of the present embodiment is fixed to the purlin member 2 in such manner that the terminal box 52 is housed within a space formed between the purlin members 2 which are arranged side by side at a predetermined interval in the eaves-ridge direction.

A part (at least a part) of the purlin member 2 is arranged in the space 80, which is located on the ridge side with respect to the back surface member 13.

Then, the slate tiles 3 are laid on a further upper side of the upper stage solar cell module 4b from the state illustrated in FIG. 15. Accordingly, the roof structure 1 is formed (refer to FIG. 1).

In the roof structure 1 of the present embodiment, as illustrated in FIG. 1, there are formed a region in which only the slate tiles 3 are laid while no solar cell module 4 is arranged (hereinbelow, also referred to as a roof member laid region) and a region in which only the solar cell modules 4 are laid while no slate tile 3 is laid (hereinbelow, also referred to as a module laid region).

In the roof member laid region, a part of the lower stage slate tile 3 is located under the upper stage slate tile 3, and only the other part thereof is exposed to the outside. In the solar cell module 4 in the module laid region, only the exposed region 34 of the cover glass 28 and the eaves side region 44 of the decorative glass 16 are exposed to the outside.

Figure 17:
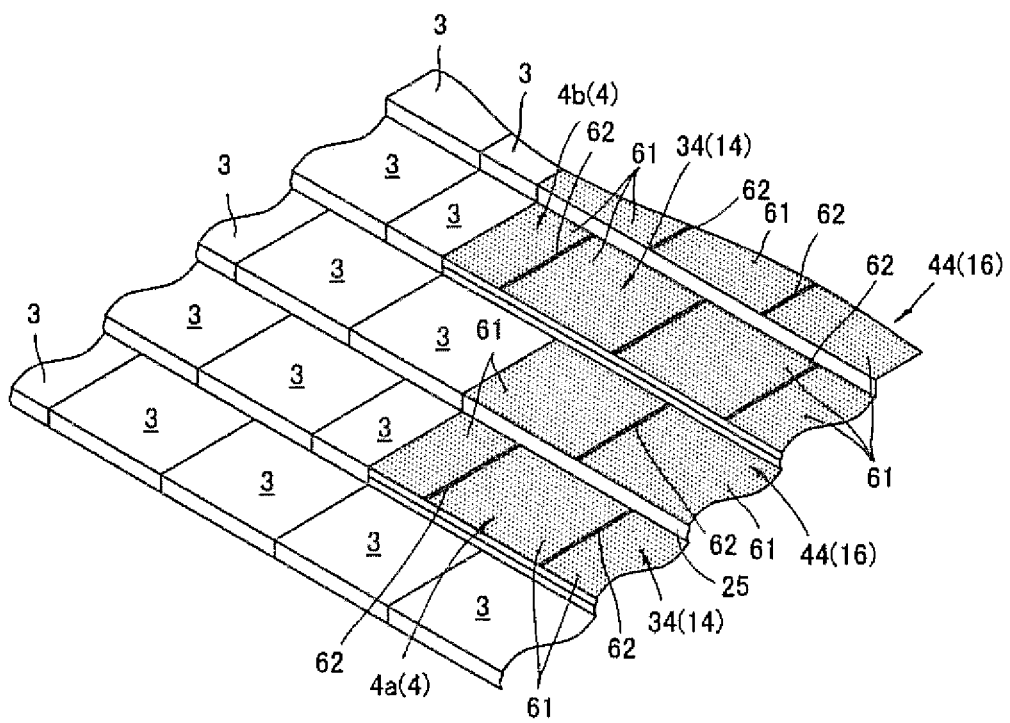
FIG. 17 is a perspective view illustrating a part A of FIG. 1 in an enlarged manner.

As illustrated, for example, in FIG. 17, in the solar cell module 4 of the present embodiment, a step 25 is formed between the exposed region 34 of the cover glass 28 as a front face of the solar cell section 14 and the eaves side region 44 of the decorative glass 16. The step 25 is similar to a step formed between the slate tile 3 that is located on the lateral side in the width direction of the exposed region 34 of the cover glass 28 and the slate tile 3 that is located on the lateral side in the width direction of the eaves side region 44 of the decorative glass 16.

That is, a difference of elevation formed between an upper face of the exposed region 34 of the cover glass 28 and an upper face of the eaves side region 44 of the decorative glass 16 is equal to (or substantially equal to) a difference of elevation between an upper face of the slate tile 3 located on the lateral side in the width direction of the exposed region 34 and an upper face of the slate tile 3 located on the lateral side in the width direction of the eaves side region 44.

As described above, the roughened part 61 which is surface-treated to be roughened is formed in the exposed region 34 of the cover glass 28 and the eaves side region 44 of the decorative glass 16, and the smooth part 62 which is not surface-treated is located at the edge of the roughened part 61. The roughened part 61 which is planarly distributed is extremely similar to the slate tile 3 in color and texture (surface roughness) on the surface thereof, and the smooth part 62 looks like a black line.

Thus, when looking at the exposed region 34 of the cover glass 28 and the eaves side region 44 of the decorative glass 16, the appearance thereof looks as if the slate tiles 3 were laid.

That is, the roughened part 61 which is a substantially quadrangular plane in plan view has substantially the same shape as a part that is exposed to the outside in the slate tile 3 arranged in the roof member laid region. Further, the roughened part 61 formed in the exposed region 34 of the cover glass 28 and the roughened part 61 formed in the eaves side region 44 of the decorative glass 16 are also continuous with each other through a step similar to the exposed parts of the slate tiles 3 arranged in the roof member laid region. Since the smooth part 62 looks like a black line, the smooth part 62 looks like a shadow formed in the boundary between the slate tiles 3 arranged adjacent to each other.

Accordingly, in the roof structure 1 of the present embodiment, it is extremely difficult to visually distinguish between the roof member laid region and the module laid region, and these regions look like the same at a glance. That is, a roof having a beautiful appearance with a sense of unity on the entire roof can be formed.

In the present embodiment, a width direction length of the solar cell section 14 is equal to a width direction length of the decorative glass 16. In the present embodiment, the eaves side of the decorative glass 16 protrudes from the solar cell section 14. That is, the space 80 is formed in a part on the ridge side from the solar cell section 14.

In the above embodiment, a protective sheet is adopted as the back surface member 13 of the solar cell section 14.

However, the present invention is not limited thereto.

Figure 18:
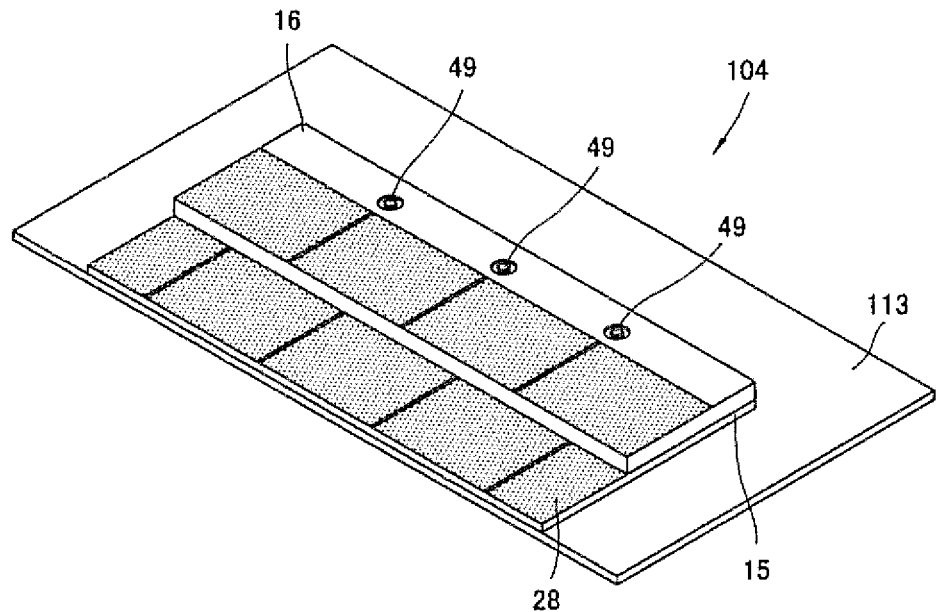
FIG. 18 is a perspective view of a solar cell module according to one or more embodiments of the present invention.
Figure 19:
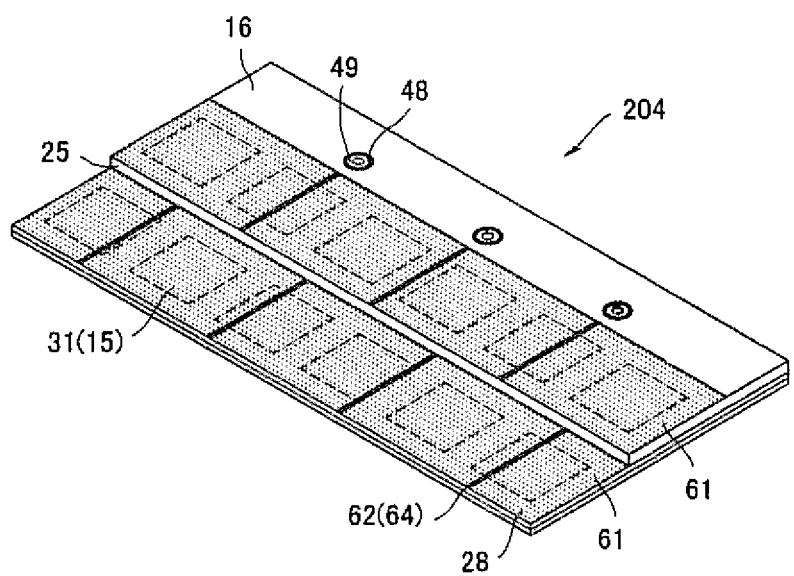
FIG. 19 is a perspective view of a solar cell module according to one or more embodiments of the present invention.

As the back surface member 13, one having rigidity such as glass or metal can also be used. For example, as illustrated in FIG. 18, there may be employed a solar cell module 104 using a back glass 113 as the back surface member 13, in which a length in the eaves-ridge direction of the back glass 113 is made long, and the ridge side end of the back glass 113 is located further on the ridge side from the ridge side end of the cover glass 28 and the ridge side end of the decorative glass 16.

In this solar cell module 104, the ridge side end of the decorative glass 16 protrudes toward the ridge side from the ridge side part of the solar cell section 14. Then, there is formed a region in which none of the solar cell section 14, the cover glass 28, and the decorative glass 16 are present, on an upper side (a front side) of the ridge side part of the back glass 113.

A width direction length of the back glass 113 may be longer than a width direction length of the cover glass 28 and the decorative glass 16. That is, there may be formed a region in which none of the cover glass 28 and the solar cell 31 are present, at a further outer side with respect to a width direction end of either of the cover glass 28 and the decorative glass 16. In other words, in the solar cell module 4, a region around the end in the horizontal direction may be the region in which none of the cover glass 28 and the solar cell 31 are present.

In the above embodiment, the solar cell section 14 that is so-called crystalline solar cell section has been adopted.

Instead of this, a thin film solar cell section may be adopted. That is, there may be employed a solar cell module provided with a solar cell section in which a conductive film or a semiconductor film is laminated on a rear face side of a cover glass 28, and this rear face side is sealed with a part of a back surface member 13. For example, there may be employed a solar cell section formed with a laminate body in which the cover glass 28, a thin film solar cell, a cell EVA sheet, and the back surface member 13 are laminated in this order from the front side.

The solar cell section according to one or more embodiments of the present invention may have any structure that seals the rear face side with a back glass. Examples of the solar cell section include various solar cells such as a crystal silicon solar cell, a solar cell that uses a semiconductor substrate other than silicon such as GaAs, a silicon-based thin film solar cell which includes a transparent electrode layer formed on a pin junction or a pn junction of an amorphous silicon-based thin film or a crystalline silicon-based thin film, a compound semiconductor solar cell such as CIS or CIGS, a dye-sensitized solar cell, and an organic thin film solar cell that uses an organic thin film (conductive polymer).

Although, in the above embodiment, there has been described an example in which the smooth part 62 is a region that linearly extends in the eaves-ridge direction (vertical direction), the present invention is not limited thereto.

For example, the masking tape 60 may be stuck in a manner to extend in the horizontal direction (lateral direction), to form a smooth part as a region that extends in the horizontal direction (lateral direction). Alternatively, the smooth part that extends in the eaves-ridge direction (vertical direction) and the smooth part that extends in the horizontal direction (lateral direction) may be present together, or only one of the smooth parts may be formed.

In the above embodiment, each of the smooth parts 62 is located at the edge of the roughened part 61 having a quadrangular shape in plan view. In other words, the upper face of the exposed region 34 of the cover glass 28 and the upper face of the eaves side region 44 of the decorative glass 16 to which a plane treatment has been applied are separated into a plurality of quadrangular regions by the smooth parts 62. However, the present invention is not limited thereto.

The shape in plan view of the roughened part 61 is not limited to a substantially quadrangular shape, and may be appropriately changed according to the shape of the exposed part of the slate tile 3 which is arranged in the roof member laid region.

In the above embodiment, there has been described an example in which the surface treatment that first performs sandblast and then applies a coating agent is executed. However, the present invention is not limited thereto.

For example, a resin containing fine particles may be applied to the surface of the cover glass 28 and the surface of the decorative glass 16 instead of the above surface treatment. That is, the resin containing fine particles may be applied without performing sandblast to form asperities on the glass surface, so that the color and the texture (surface roughness) on the surface is brought into a state extremely similar to those of the slate tile 3.

In the above embodiment, there has been described an example in which the space 80 is formed under the ridge side end of the decorative glass 16 on the ridge side from the solar cell section 14, to form the step on the rear face of the ridge side end of the solar cell module 4 (refer to FIG. 16).

As described above, with the configuration in which the space 80 is formed on the ridge side of the solar cell section 14 of the solar cell module 4, and a part of the purlin member 2 is arranged in the space 80 (refer to, for example, FIG. 16), the height of the surface of the solar cell module 4 can be further reduced. Thus, such a configuration may be used. That is, the solar cell module 4 described above has a structure in which the terminal box 52 is housed between the purlin members 2 arranged side by side at a predetermined interval in the eaves-ridge direction, and a part of the purlin member 2 is arranged in the space 80, to fix the solar cell module 4 to a lower position.

However, the present invention is not limited thereto.

Figure 20:
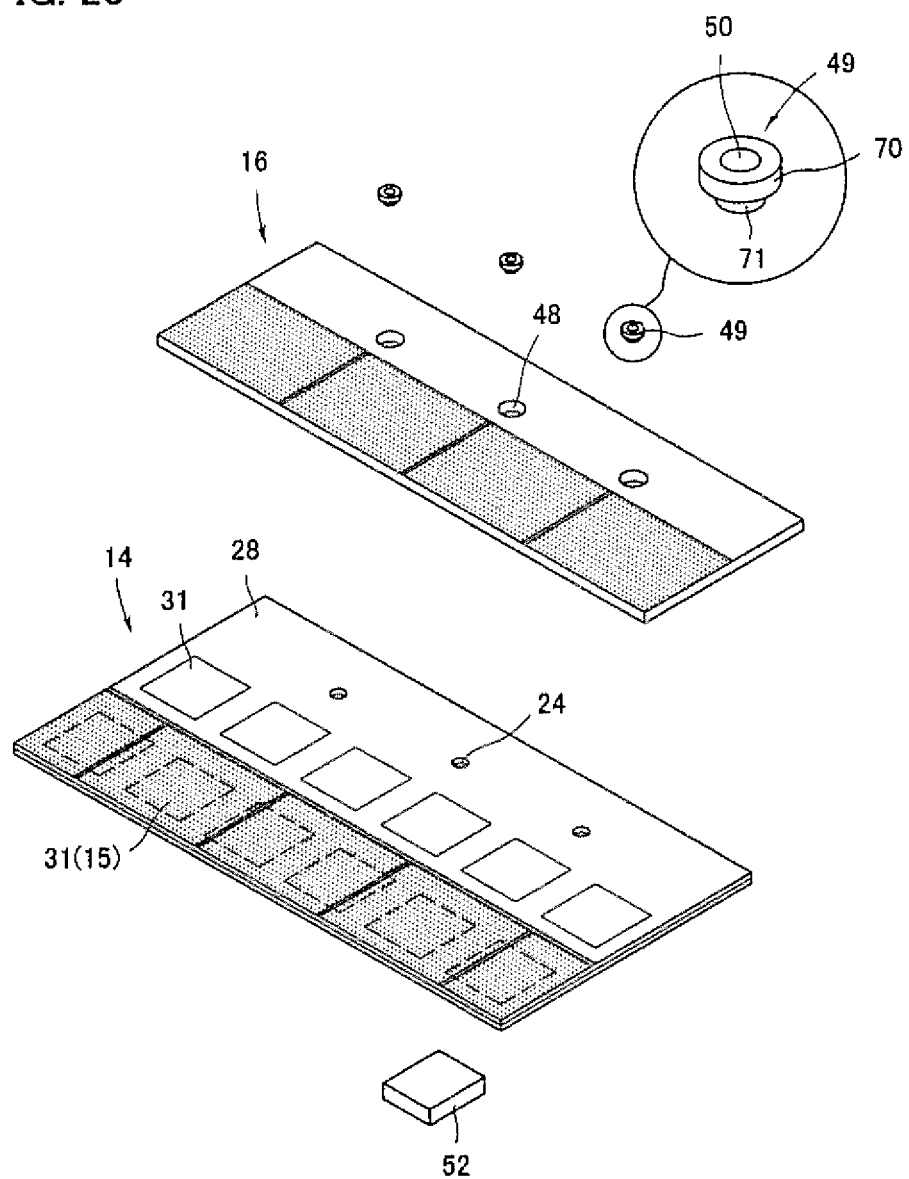
FIG. 20 is an exploded perspective view of the solar cell module of FIG. 19, illustrating a state in which the solar cell module is separated into a cell section, a step forming plate, and a terminal box.
Figure 21:
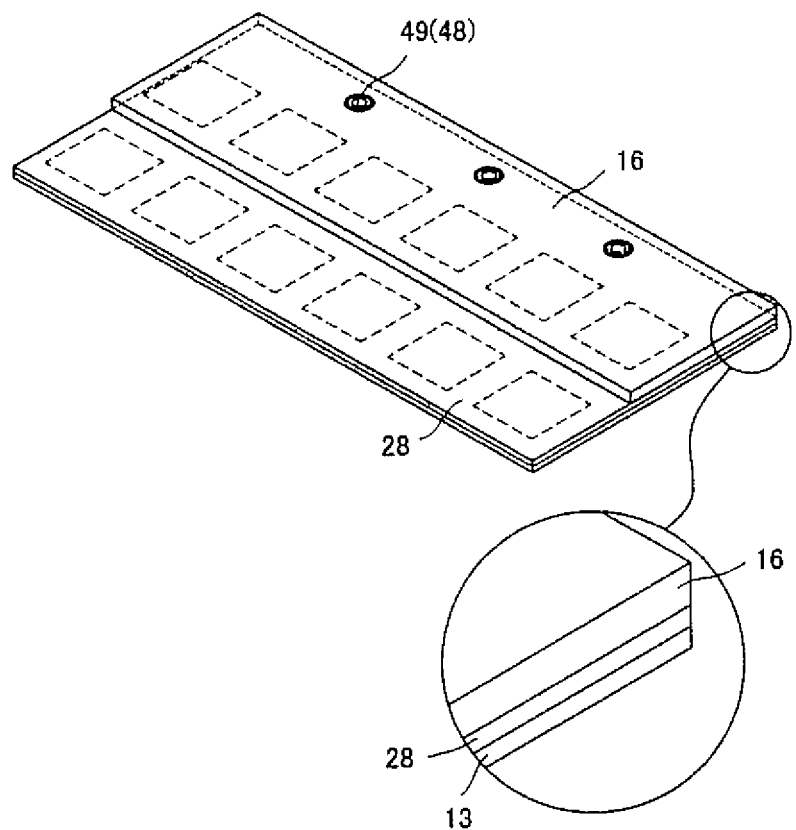
FIG. 21 is an explanatory view illustrating an assembly procedure of the solar cell module of FIG. 19, and illustrating a state in which a decorative glass has been laminated on a solar cell section.

In a solar cell module 204 shown in FIGS. 20 and 21, a ridge side edge of a decorative glass 16 is aligned with a ridge side of a solar cell section 14. Therefore, there is no step on a back surface of the solar cell module 204 on the ridge side end side.

A structure of other parts of the solar cell module 204 is the same as that of the solar cell module 4 of the first embodiment.

A structure in which the ridge side edge of the decorative glass 16 is aligned with the ridge side edge of the solar cell section 14 as in the solar cell module 204 is recommended in terms of increasing rigidity of the solar cell module 204.

In particular, it is a configuration recommended for the case where a sheet-like member is adopted as the back surface member 13. When a sheet-like member is used as the back surface member 13 and the thickness thereof is thin and the rigidity is low, it is desirable that the ridge side edge of the decorative glass 16 is aligned with the ridge side of the solar cell section 14, and there is substantially no step between these ridge sides as in the solar cell module 204 shown in FIG. 20.

Figure 22:
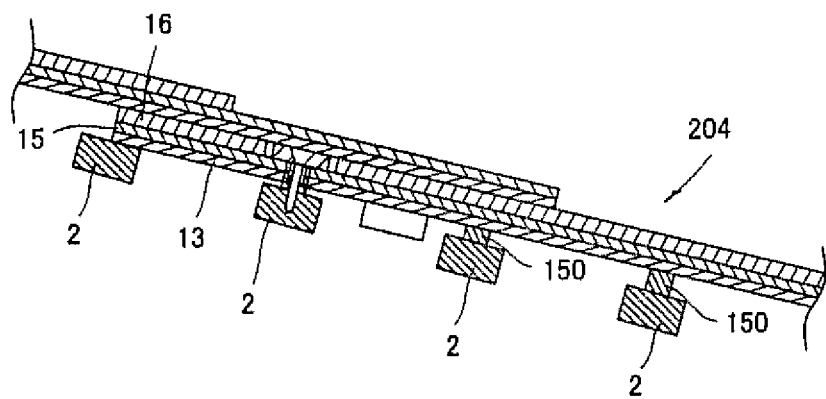
FIG. 22 is a sectional view illustrating a roof structure formed by mounting the solar cell module of FIG. 19.

Since a manufacturing method of the solar cell module 204 is not much different from that of the above-described solar cell module 4, the same members as those in the previous embodiment are denoted by the same reference numerals and redundant explanations are omitted, for the explanatory view illustrating an assembly procedure of the solar cell module in FIG. 22.

In the solar cell module 204, the ridge side end of the back surface member 13 (the back surface member of a back glass or a protective sheet) and the ridge side end of the decorative glass 16 have the same (substantially the same) position in the eaves-ridge direction. That is, in this solar cell module 204, the ridge side edge of the solar cell section 14 and the ridge side edge of the front (or rear) face of the decorative glass 16 overlaps with each other.

When the solar cell module 204 having such a configuration is fixed to the purlin member 2, it is recommended that the solar cell module 204 and the purlin member 2 are integrally fixed with a spacer 150 disposed therebetween.

In the above embodiment, there has been described an example in which the upper stage solar cell module 4b is fixed at the position shifted by the width dimension L1 (refer to FIG. 2) of the slate tile 3 in the horizontal direction with respect to the lower stage solar cell module 4a. That is, an example has been described in which a shift width in the horizontal direction between the upper stage solar cell module 4b and the lower stage solar cell module 4a is equal to the width dimension L1 of the slate tile 3. However, the present invention is not limited thereto. For example, the shift width may be twice the width dimension of the slate tile 3 (L1×2) or half the width dimension of the slate tile. These configurations may be changed according to the shape and the area of a roof on which the solar cell module 4 is laid or the number of solar cell modules 4 to be laid. However, in view of improving the beauty of the entire roof, the shift width may be an integral multiple of half the width dimension L1 of the slate tile 3.

Although, in the above embodiment, there has been described an example in which the surface treatment is performed with the terminal box 52 fixed to the rear face side of the back surface member 13, the present invention is not limited thereto. It is needless to say that the terminal box 52 may be fixed after performing the surface treatment to form the solar cell module 4.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATION OF REFERENCE SIGNS

1: roof structure (or "roof system")
2: purlin member (crosspiece, outer member)
3: slate tile (roof member)
4, 104, 204: solar cell module 13, 113, 213: back glass (back surface member)
16: decorative glass (step forming plate)
21: outer region (surplus region)
24: fastening element insertion hole (through hole)
25: step
28: cover glass (front side transparent plate)
31: solar cell
48: bushing insertion hole (through hole)
49: bushing member (buffer member)
52: terminal box
61: roughened part
62: smooth part

The invention claimed is:

1. A solar cell module, comprising a solar cell section and a step forming plate,
wherein the solar cell section comprises:
  a front side transparent plate;
  a back surface member; and
  a solar cell sealed between the front side transparent plate and the back surface member,
wherein the step forming plate is disposed on a front side of the front side transparent plate, overlapping only partly with the front side of the front side transparent plate and forming a step between the solar cell section and the step forming plate, and
wherein the step forming plate has a light transmissive property and at least partly overlaps with the solar cell in a plan view.

2. The solar cell module according to claim 1,
wherein the solar cell comprises a plurality of crystalline solar cells planarly and unevenly distributed between the front side transparent plate and the back surface member,
wherein the solar cell module comprises:
  a cell installation region including the plurality of crystalline solar cells, each of the crystalline solar cells being disposed with an interval equal to or less than a predetermined distance to, or in contact with an adjacent crystalline solar cell; and
  a surplus region not including any of the crystalline solar cells,
wherein the step forming plate has a light transmissive property, and
wherein the step forming plate is disposed over the surplus region and a part of the cell installation region.

3. The solar cell module according to claim 1, wherein the step forming plate is disposed on the front side of the front side transparent plate, overlapping with 30% or more of a light receiving surface of the solar cell.

4. The solar cell module according to claim 1,
wherein the step forming plate and the solar cell section each comprise a through hole, both the through holes communicating with each other and forming a communicating hole, and
wherein the solar cell module is fixable to an outer member by inserting a fastening element into the communicating hole.

5. The solar cell module according to claim 4, further comprising a tubular member,
wherein the tubular member is provided inside the communicating hole, and
wherein a tip of the tubular member protrudes from the back-surface member to a rear face side of the solar cell module to be capable of protruding into another member.

6. The solar cell module according to claim 4, further comprising a tubular member, wherein the tubular member is provided inside the communicating hole and embedded in the communicating hole without protruding at least over a front side of the solar cell module.

7. The solar cell module according to claim 1,
wherein the front side transparent plate is a glass plate, and
wherein a front face of the front side transparent plate comprises:
   a roughened part that is roughened and planarly distributed; and
   a smooth part that keeps smoothness and linearly extends vertically and/or horizontally, the smooth part separating the roughened part into a plurality of quadrangular shapes.

8. The solar cell module according to claim 1,
wherein the solar cell module is laid on a roof in combination with a plurality of roof members of another system,
wherein the plurality of roof members comprise first and second roof members that are adjacent to each other in a ridge direction, and
wherein the solar cell module imitates a shape in which the second roof member is laid on a part of the first roof member in the ridge direction.

9. The solar cell module according to claim 8,
wherein the first and the second roof members are each a non-functional tile material having no power generating function,
wherein the second roof member is laid on the first roof member, overlapping partly with the first roof member, an exposed part of the first roof member other than a part overlapping with the second roof member being exposed to an open area, and
wherein a width in a eaves-ridge direction of a first exposed region of the front side transparent plate is substantially equal to a width in the eaves-ridge direction of the exposed part, the first exposed region being a region not overlapping with the step forming plate.

10. The solar cell module according to claim 8,
wherein the first and the second roof members are each a non-functional tile material having no power generating function,
wherein the second roof member is laid on the first roof member, overlapping partly with the first roof member, an exposed part of the first roof member other than an area overlapping with the second roof member being exposed to an open area,
wherein the solar cell module is a first solar cell module adjacent to a second solar cell module in the ridge direction,
wherein the second solar cell module or one of the plurality of roof members is laid on the first solar cell module, overlapping partly with the first solar cell module, a second exposed region being a region of the step forming plate of the first solar cell module other than a region overlapping with the second solar cell or the one of the plurality of roof members, and
wherein a width in a eaves-ridge direction of the second exposed region of the step forming plate is substantially equal to a width in the eaves-ridge direction of the exposed part.

11. A roof system comprising a plurality of the solar cell modules according to claim 2, the solar cell modules being laid on a top face of a building,
wherein the plurality of the solar cell modules comprise a first solar cell module and a second solar cell module, and
wherein a part of a region corresponding to the cell installation region of the second solar cell module is laid on the surplus region of the first solar cell module.

12. The roof system according to claim 11,
wherein a roof member having a water proofing property and formed in a certain shape is used together with the solar cell module, and
wherein the roof system comprises a region in which the roof member is laid while the solar cell module is not laid, and a region in which the solar cell module is laid while the roof member is not laid.

13. A roof system comprising a plurality of the solar cell modules according to claim 1, the solar cell modules being laid on a top face of a building,
wherein the plurality of the solar cell modules comprise a first and a second solar cell modules, and
wherein a region corresponding to the solar cell section of the second solar cell module is laid on the step forming plate of the first solar cell module in a shifted manner.

14. A roof system comprising the solar cell module according to claim 5, the solar cell module being laid on a top face of a building,
wherein a crosspiece is provided on the top face of the building,
wherein the solar cell module is laid on the crosspiece while the tip of the tubular member penetrates into the crosspiece, and
wherein the fastening element protrudes from the tubular member to be joined into the crosspiece, fixing the solar cell module to the crosspiece.

15. A roof system comprising the solar cell module according to claim 6, the solar cell module being laid on a top face of a building,
wherein the fastening element is inserted through the tubular member to fix the solar cell module to the building while the fastening element does not protrude from the front side of the solar cell module.

16. A solar cell module, comprising a solar cell section and a step forming plate,
wherein the solar cell section comprises:
   a front side transparent plate;
   a back surface member; and
   a solar cell sealed between the front side transparent plate and the back surface member,
wherein the step forming plate is disposed on a front side of the front side transparent plate, overlapping only partly with the front side of the front side transparent plate and forming a step between the solar cell section and the step forming plate,
wherein the step forming plate has a light transmissive property and at least partly overlaps with the solar cell in a plan view, and
wherein the solar cell comprises a plurality of crystalline solar cells planarly and unevenly distributed between the front side transparent plate and the back surface member.

17. A solar cell module, comprising a solar cell section and a step forming plate,
wherein the solar cell section comprises:
   a front side transparent plate;
   a back surface member; and
   a solar cell sealed between the front side transparent plate and the back surface member, wherein the step forming plate is disposed on a front side of the front side transparent plate, overlapping only partly with the front side of the front side transparent plate and forming a step between the solar cell section and the step forming plate, wherein the step forming plate has a light transmissive property and at least partly overlaps with the solar cell in a plan view, and wherein a front face of the front side transparent plate comprises:
  a roughened part that is roughened and planarly distributed.

* * * * *